United States Patent [19]
Ema et al.

[11] Patent Number: 5,591,659
[45] Date of Patent: Jan. 7, 1997

[54] PROCESS OF PRODUCING A SEMICONDUCTOR DEVICE IN WHICH A HEIGHT DIFFERENCE BETWEEN A MEMORY CELL AREA AND A PERIPHERAL AREA IS ELIMINATED

[75] Inventors: Taiji Ema; Toshimi Ikeda, both of Kawasaki, Japan

[73] Assignee: Fujitsu Limited, Kanagawa, Japan

[21] Appl. No.: 318,261

[22] Filed: Oct. 5, 1994

Related U.S. Application Data

[63] Continuation-in-part of Ser. No. 46,149, Apr. 15, 1993, abandoned.

[30] Foreign Application Priority Data

| Apr. 16, 1992 | [JP] | Japan | 4-096726 |
| Oct. 9, 1992 | [JP] | Japan | 4-271622 |
| Aug. 29, 1994 | [JP] | Japan | 6-203663 |

[51] Int. Cl.⁶ .............................. H01L 21/70; H01L 27/00
[52] U.S. Cl. .............................. 437/52; 437/919
[58] Field of Search .............................. 437/919, 48, 47, 437/52, 60, 919

[56] References Cited

U.S. PATENT DOCUMENTS

| 4,953,126 | 8/1990 | Ema | 365/182 |
| 5,047,817 | 9/1991 | Wakamiya et al. | 257/300 |
| 5,053,351 | 10/1991 | Fazan et al. | 437/52 |
| 5,091,761 | 2/1992 | Hiraiwa et al. | 357/23.6 |
| 5,126,810 | 6/1992 | Gotou | 357/23.6 |
| 5,153,685 | 10/1992 | Murata et al. | 357/23.6 |
| 5,168,073 | 12/1992 | Gonzaelz et al. | 437/47 |
| 5,196,910 | 3/1993 | Moriuchi et al. | 357/23.6 |
| 5,237,187 | 8/1993 | Suwanai et al. | 257/296 |
| 5,245,205 | 9/1993 | Higasitani et al. | 257/296 |
| 5,266,513 | 11/1993 | Fazan et al. | 437/52 |
| 5,389,558 | 2/1995 | Suwanai et al. | 437/52 |

FOREIGN PATENT DOCUMENTS 5-299599  11/1993  Japan.

OTHER PUBLICATIONS

"1992 Symposium on VLSI Technology" Digest of Technical Papers, A 0.72 unit Recessed STC (RSTC) Technology for 256 Mbit DRAMS using Quarter-Micron Phase Shift Lithography, Sagara et al. pp. 10–11.

*Primary Examiner*—H. Jey Tsai
*Attorney, Agent, or Firm*—Nikaido Marmelstein Murray & Oram LLP

[57] ABSTRACT

A semiconductor device comprising: a semiconductor substrate having a memory cell area containing a memory cell composed of a capacitor element, and a peripheral circuit area containing a peripheral circuit for controlling the memory cell; an insulating layer covering the peripheral circuit area and being absent in the memory cell area; protective layers effective in etching of the insulating layer and covering the top surfaces and side surfaces of word line conductor patters and bit line conductor patterns in the memory cell area; a contact hole having a circumference defined by one of the protective layers that covers side surfaces of the word line conductor patterns in the memory cell area, the contact hole extending to a diffused region in the semiconductor substrate; and a storage electrode of the capacitor element being connected to the diffused region through the contact hole. A process of producing the semiconductor device is also disclosed.

10 Claims, 44 Drawing Sheets

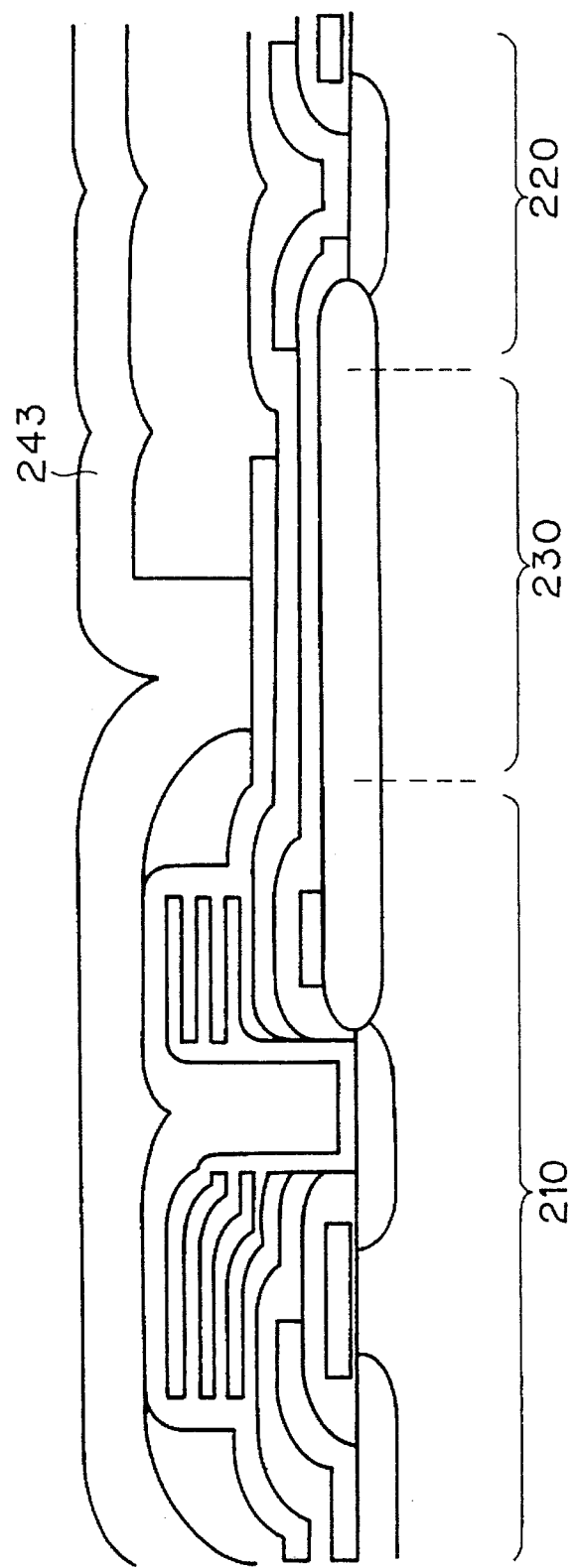

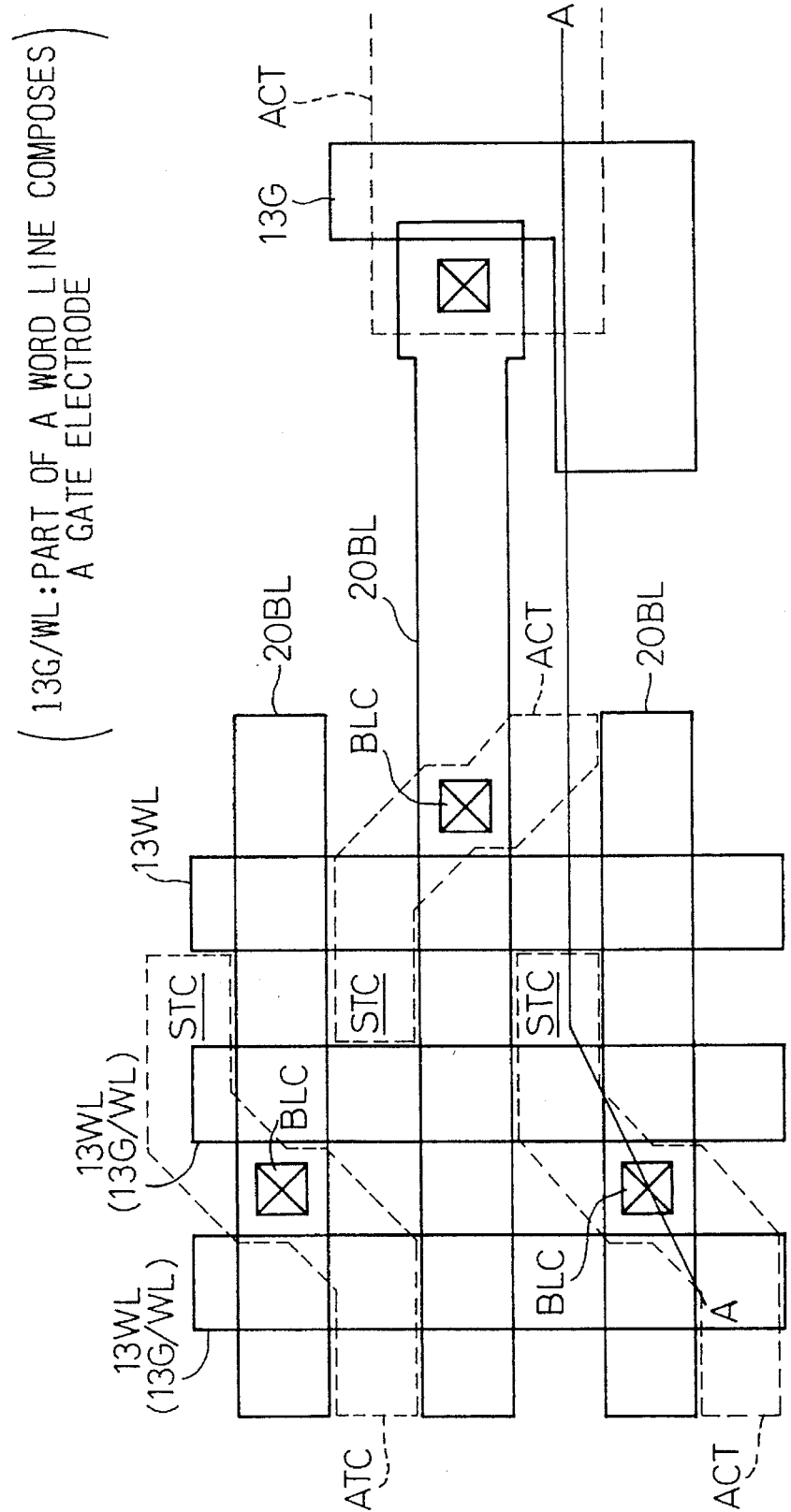

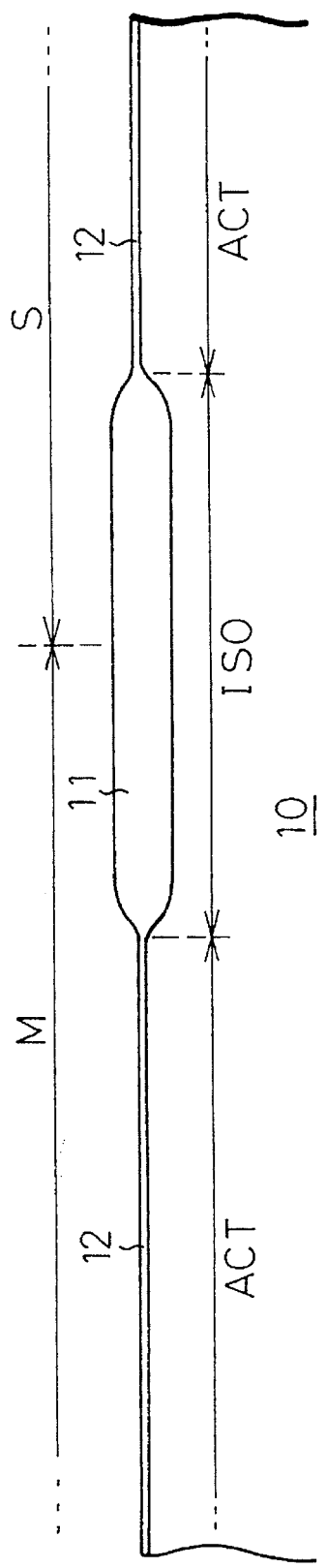

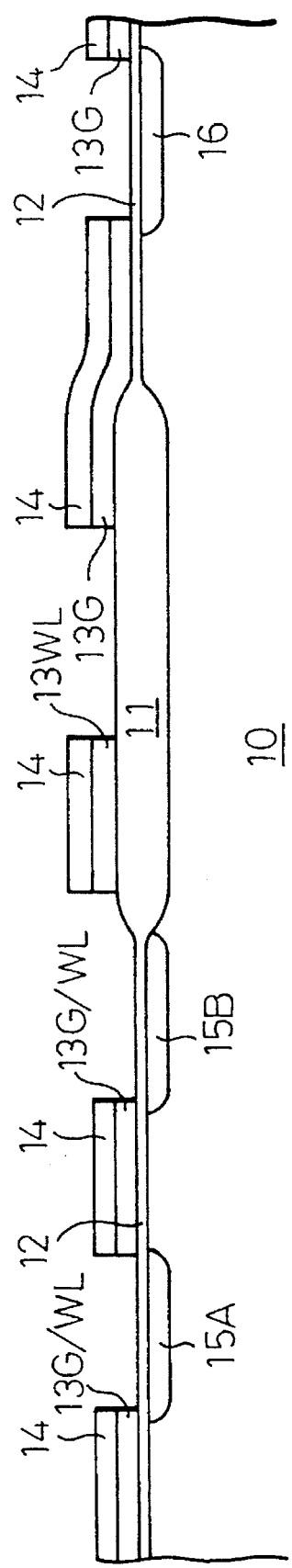

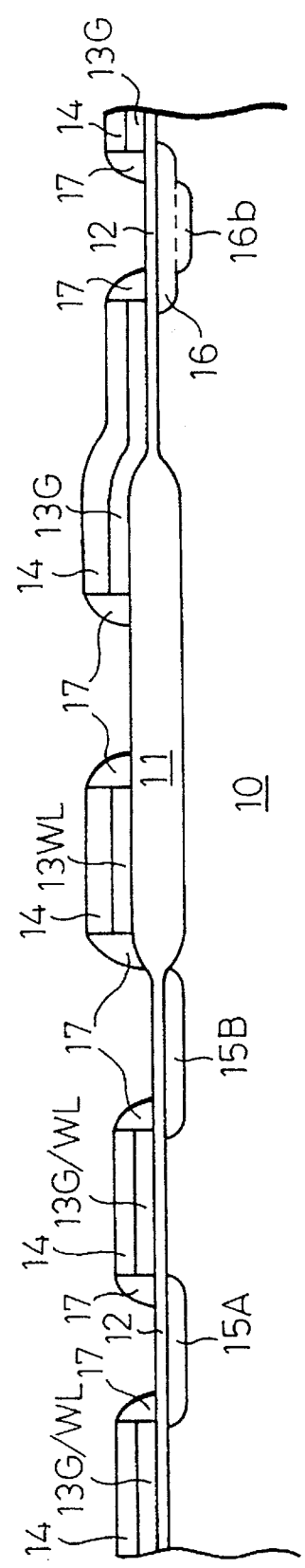
Fig. 12(c) [STEP 3]

[STEP 4]

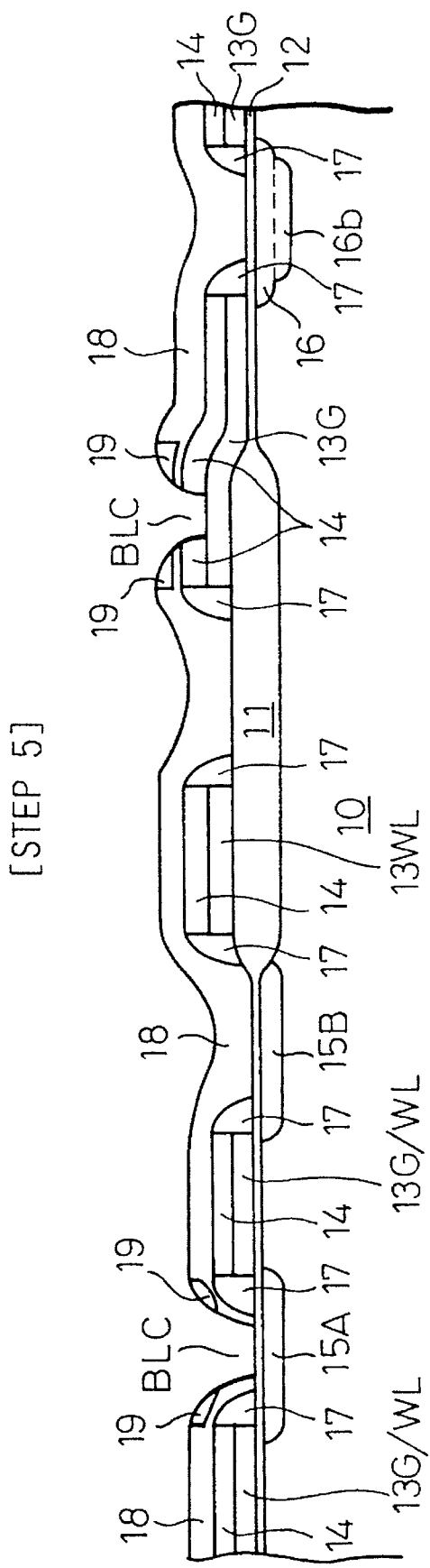

[STEP 6]

[STEP 7]

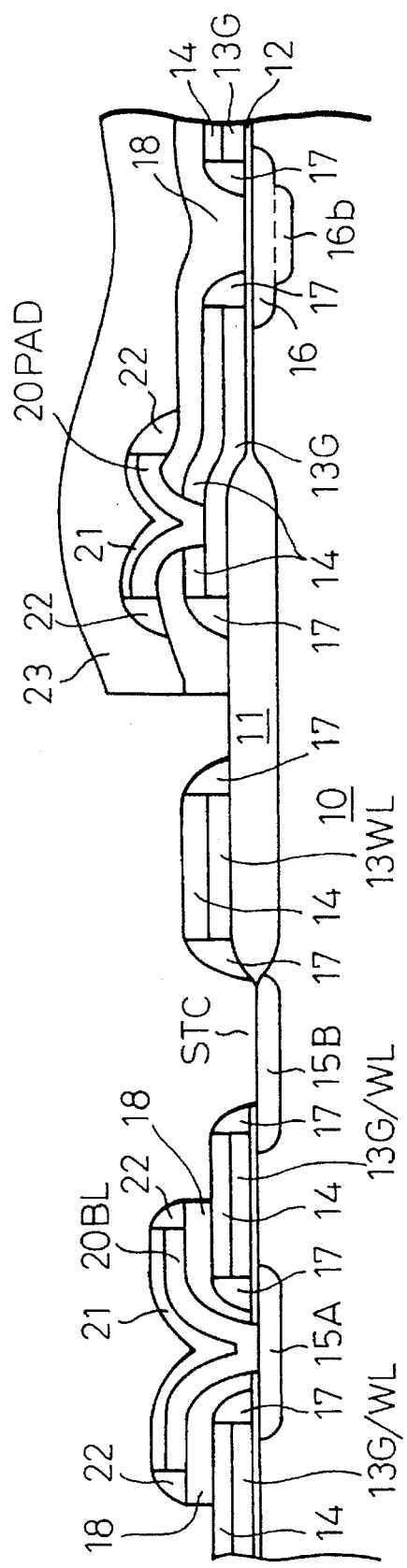

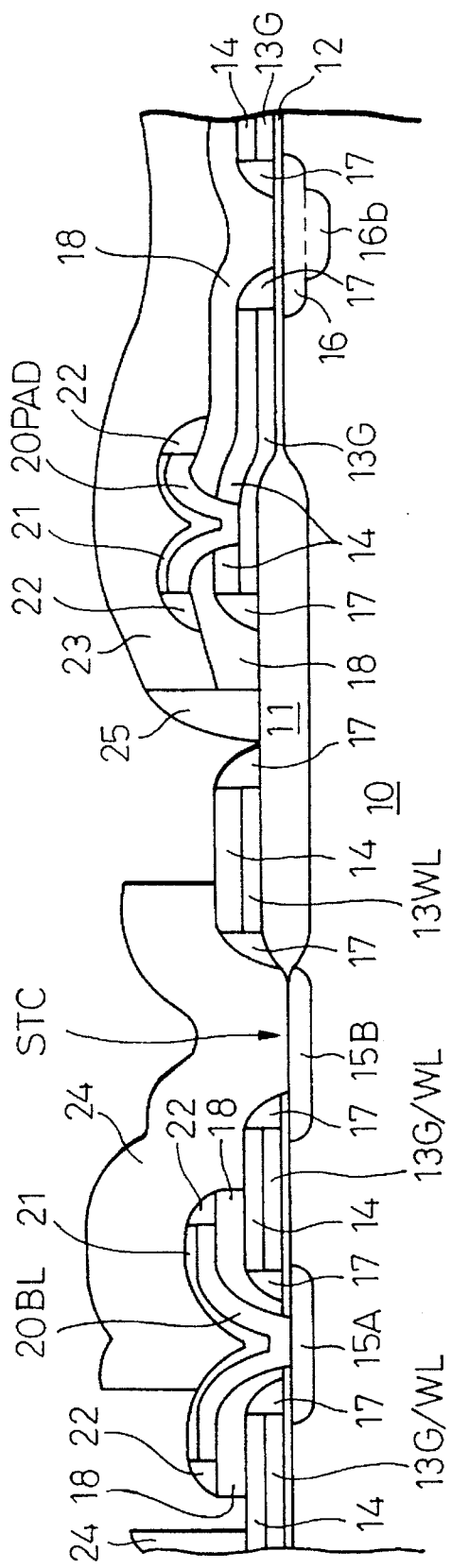
Fig.12(λ)
[STEP 9]

[STEP 10]

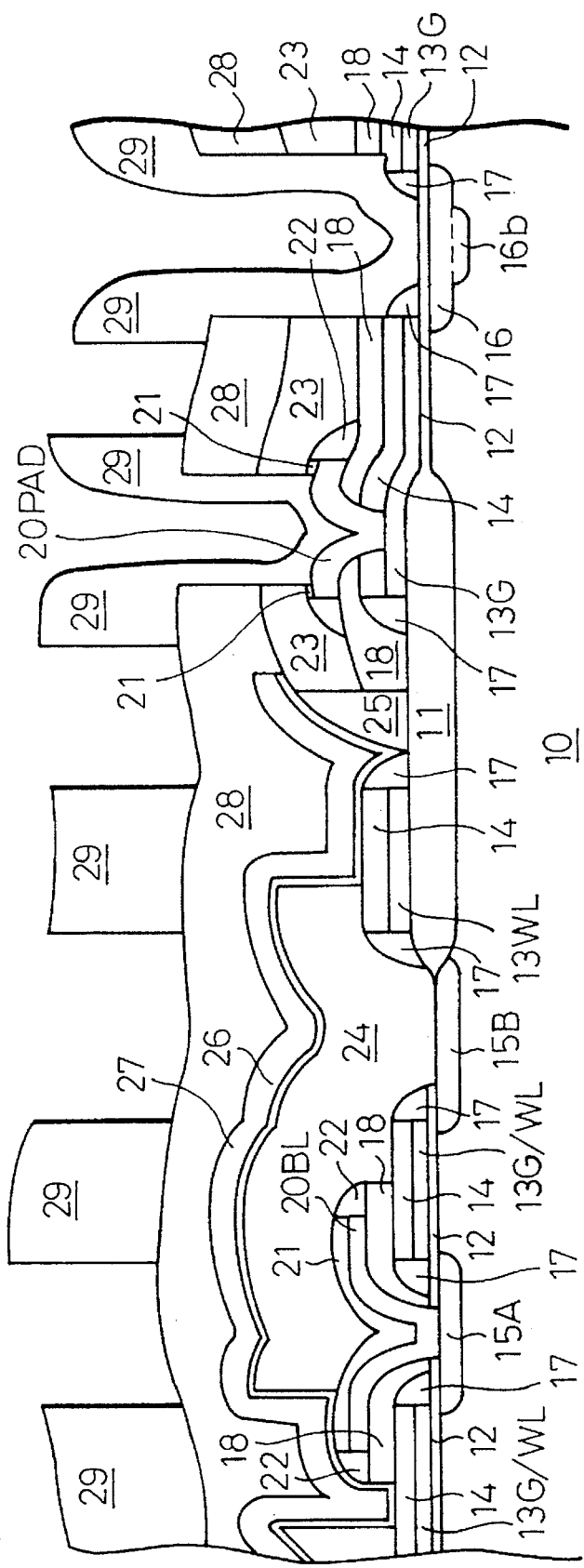
Fig.12(k) [STEP 11]

[STEP 3]

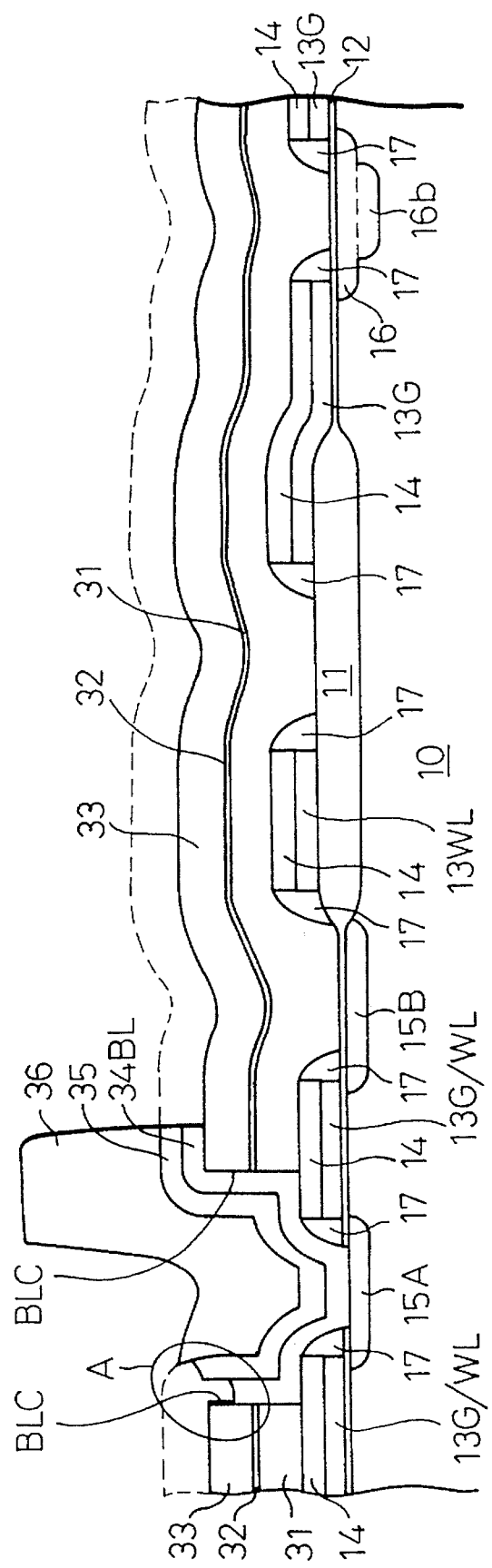

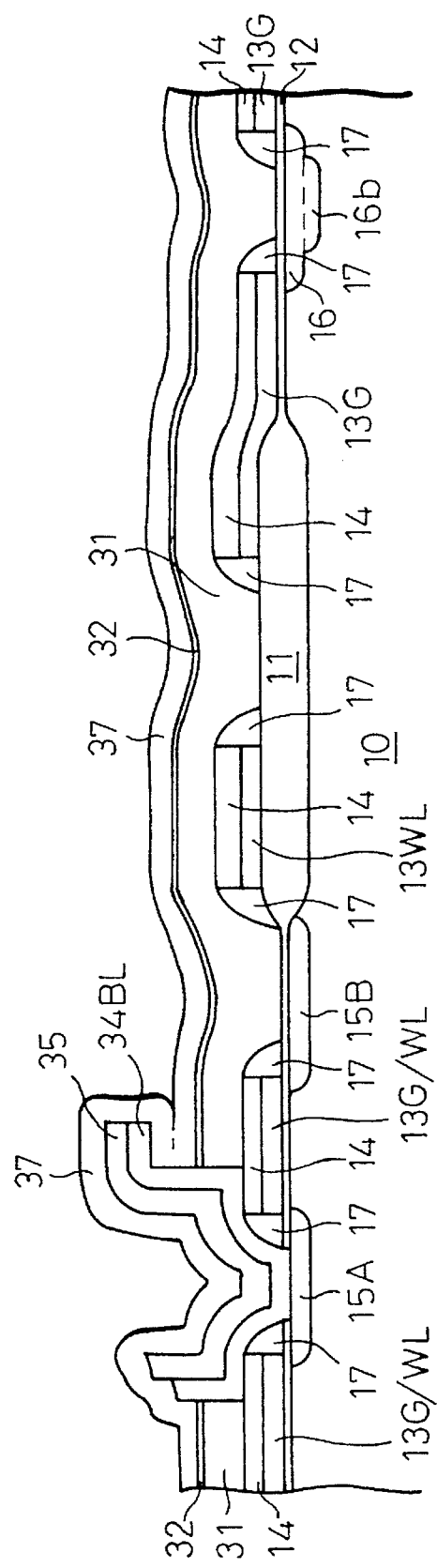

[STEP 6]

[STEP 7]
SUBSTEP 1

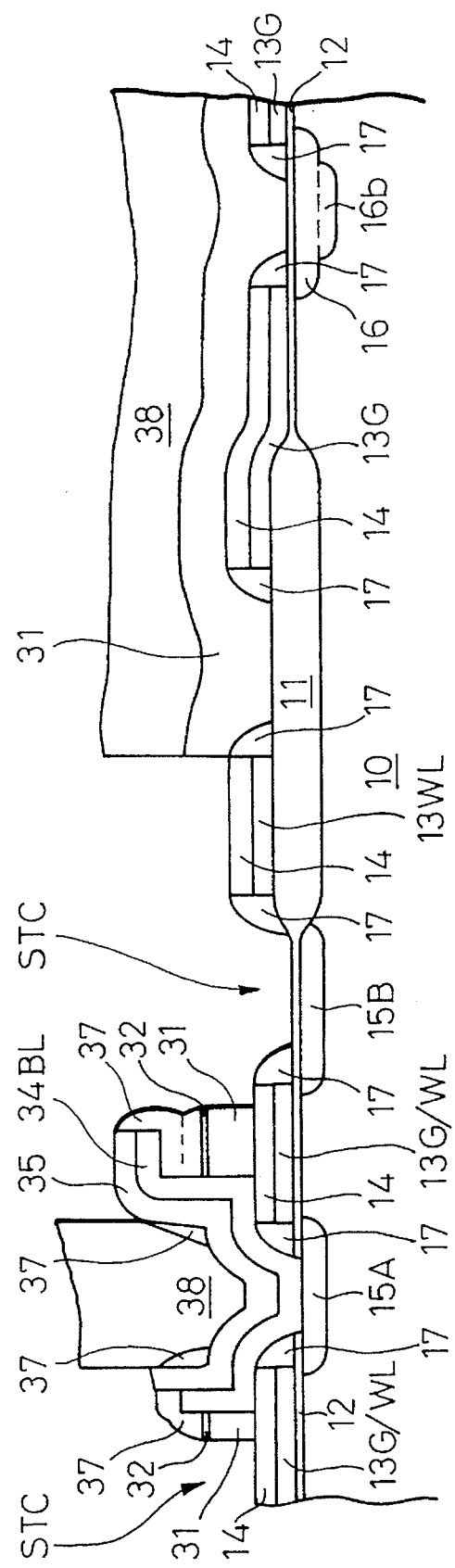

[STEP 7]
SUBSTEP 3

[STEP 7]
SUBSTEP 4

[STEP 7]
SUBSTEP 5

[STEP 7] SUBSTEP 6

[STEP 8]

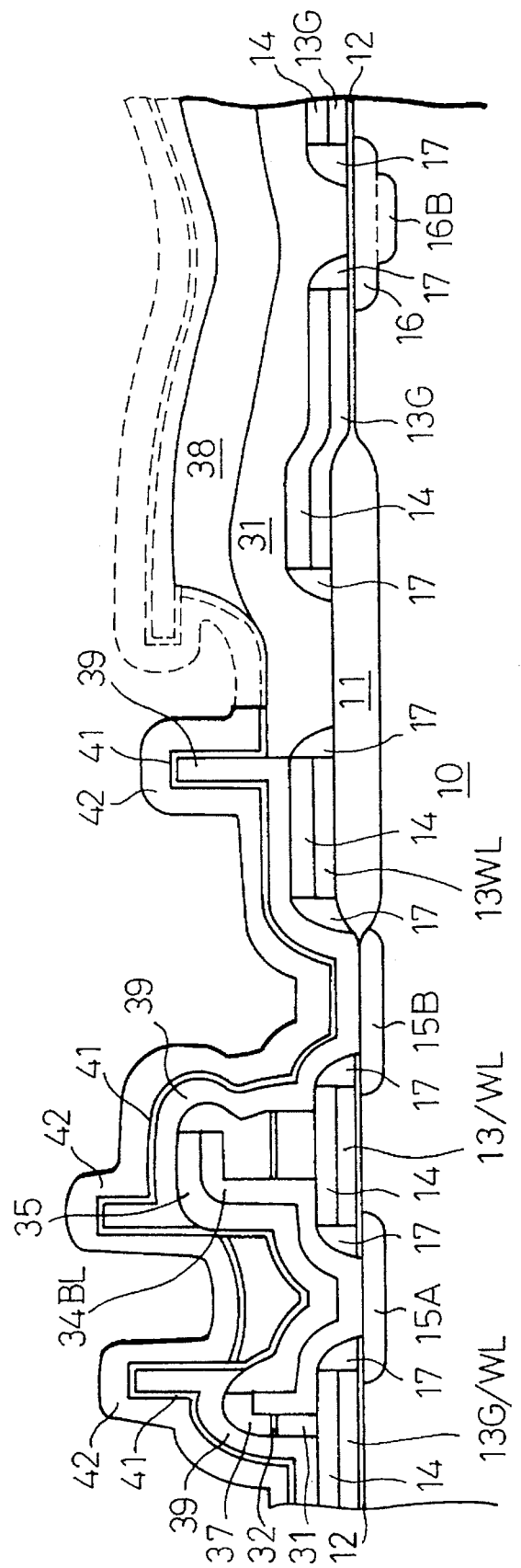
Fig. 13(ℓ)
[STEP 9]

[STEP 10]

5,591,659

PROCESS OF PRODUCING A SEMICONDUCTOR DEVICE IN WHICH A HEIGHT DIFFERENCE BETWEEN A MEMORY CELL AREA AND A PERIPHERAL AREA IS ELIMINATED

CROSS-REFERENCES TO RELATED APPLICATIONS

This application is a continuation-in-part application of U.S. Ser. No. 08/046,149 filed on Apr. 15, 1993 now abandoned.

BACKGROUND OF THE INVENTION

1. Field of the Invention

The present invention relates to a semiconductor device and a process of producing same, particularly to a semiconductor memory device having a difference in height between a memory cell area and a peripheral circuit area surrounding the memory cell area.

2. Description of the Related Art

Highly integrated DRAMs tend to have the capacitor electrode of a greater height to ensure a greater storage capacity. Capacitors are provided only in the memory cells but not in the surrounding circuit areas, causing increase in the difference between heights of the memory cell area and the surrounding circuit area. The increased integration or refinement involves the narrowing of conductor wirings running above the memory cell area and the surrounding circuit area. This reduces the focus depth allowance upon exposure for forming the conductor pattern. The abovementioned increase in the height difference further reduces the focus depth allowance.

This phenomenon is fully described in Japanese Patent Application No. 3-285088 by the same assignee, in which the present inventors proposed to design memory cells so as to be covered by the focus depth allowance of the exposing apparatus. This proposal, however, uses an ECC (error correction code) to suppress the natural α-rays soft error and the ECC unavoidably causes a drop in the working speed of the device.

An SRAM (static random access memory) cell composed of MOS transistors is expressed as an equivalent circuit as shown in FIG. 1, containing driving MOSFETs t11 and t12, loading MOSFETs t21 and t22, and transfer MOSFETs t31 and t32.

The driving MOSFETs t11 and t12 have channel regions formed in the bulk body of a semiconductor substrate and the loading MOSFETs t21 and t22 have channel regions formed in polycrystalline semiconductor layer on the semiconductor substrate.

FIG. 2A shows a sectional view of the MOSFETs in the portion enclosed by the broken line of FIG. 1.

An active region X surrounded and defined by a selectively oxidized layer 382 on a semiconductor substrate 381. The driving MOSFET t11 has a gate electrode 383 formed on the substrate 381 in the active region X with a gate insulating layer 384 interposed between the electrode 383 and the substrate 381. The gate electrode 383 has one end stepping over the selectively oxidized region 382 and connected to an impurity-doped region 385.

Above an insulating layer 386 covering the gate electrode 383, a lower gate electrode 387, a polycrystalline semiconductor layer 388 and an upper gate electrode 389 are formed to compose a loading MOSFET t22, with insulating layers 390 and 391 interposed between the lower electrode 387 and the Semiconductor layer 388 and between the semiconductor layer 388 and the upper insulating layer 389, respectively.

The polycrystalline semiconductor layer 388 has a channel region with introduced impurities on the both sides thereof to define source/drain regions. The two gate electrodes (or double gates) 387 and 389 are connected to the source/drain regions of the loading MOSFET t21 located on the substrate 381.

A contact hole 392 is formed through the insulating layers 386, 390 and 391 and through the polycrystalline semiconductor layer 388, which are located on the gate electrode 383 stepping over the selectively oxidized layer 382. The contact hole 392 has a side wall and a bottom surface which are coated with a conductive layer 393 having a U-shaped section. This arrangement connects the gate electrode 383 of the driving MOSFET t11 to one of the source/drain regions of the loading MOSFET t22.

The impurity-doped region 385 defined in the active region X is connected to one end of the gate electrode 383 of the driving MOSFET t11 and is connected to one of source/drain regions 394 and 395 of the transfer MOSFET t31. Gate electrode 396 of the transfer MOSFET t31 is formed on the semiconductor substrate 381 with a gate insulating layer interposed therebetween.

An insulating layer 397 covers the SRAM area Y and the surrounding area Z.

As described above, the loading MOSFET t22 has two gate electrodes 387 and 389 and the semiconductor layer 388, which are formed on the semiconductor substrate 381, to form a multiple-layered structure, so that the SRAM cell area Y is higher than the surrounding circuit area Z to form a step of height "d".

To minimize the step height "d", a BPSG (borophosphosilicate glass) layer 397 is formed all over the substrate and is then heated to relfow, as shown in FIG. 2B.

This cannot provide sufficient flattening where the height of SRAMs tends to increase more and more. For example, the step height is not reduced sufficiently when a capacitor "Q" is formed on the loading MOSFET t22 in order to avoid α-rays soft errors, as shown in FIG. 3A.

The capacitor "Q" is formed by increasing the height of the space for the conductive layer 393 (FIG. 2A) which connects the gate electrode 383 of the driving MOSFET t11 to the source/drain regions of the loading MOSFET t22, forming in that space a storing electrode "SN" in the form of a fin, coating the electrode "SN" with a dielectric layer "DL" and forming a counter electrode "CP" on the layer "DL".

It is usually necessary to form contact holes simultaneously in both the SRAM cell area Y and surrounding circuit area Z or to form wiring running over both areas Y and Z, by exposing a photoresist 398 as shown in FIG. 3B. The focus depth may be smaller than the height "d" of such a large step, causing degradation of the precision of patterning.

In "Semiconductor World", December 1991, p.186, Oowada pointed out the importance of the reduction of the step height in the multiple layered wiring technology, particularly in logic ICs. This problem is common to the height difference between the memory cell and the surrounding circuit. It should be noted, however, that the height difference in logic ICs is caused by a random wiring, so that the distribution of height difference is more complicated than that in memory cells. Oowada did not suggest a solution therefor.

FIGS. 4A, 4B and 4C show a commonly known process for flattening of the wiring steps, as can be seen from "Solid State Technology", Nov. 1991, p.67–71, for example.

Referring to FIG. 4A, a wiring 111 is formed on a substrate 110 and is then covered with an insulating layer 112. The insulating layer 112 stands out in the portion of a smaller spacing of the wiring 111 than in the portion of a greater spacing. A resist pattern 113 is then formed on the insulating layer 112 in the portion with a wiring spacing greater than a certain value.

Referring to FIG. 4B, etching of the insulating layer 112 is carried out by utilizing the resist 113 as a mask to reduce the height of insulating layer 112 in the portion with a smaller spacing of the wiring 111. This etching must be precisely controlled, because an excessive etching causes an abnormal step and an insufficient etching causes an incomplete flattening.

Referring to FIG. 4C, after the resist 113 is removed, an upper insulating layer 114 is formed to complete the flattening necessary for an overlying wiring layer to be formed.

The insulating layers 112 and 114 may be far more effective when formed of composite SOG (spin-on-glass)/CVD-oxide layers than when formed of a CVD-oxide layer alone.

Another processes are known, in which a complete flattening of the wiring steps is effected by the combined use of a special polymer or film and an etching back technique, as is proposed by Numazawa et al. in the proceedings of "SEMI technology symposium", p.245–255 and by D. Wang et al., ibid, p. 257–265.

The above-recited conventional technologies, however, were intended to cover all the steps caused by a random wiring and having a complicated pattern, in which the following substantial problems are remaining:

1) A high precision etching technique is necessary;
2) The use of a special polymer is not only a disadvantage in itself but also necessitates etching control to avoid leaving remains of such a polymer; and
3) An etching control for simultaneously etching-back layers of different materials is necessary.

A further disadvantage is that the heat treatment temperature is rigidly limited because the wiring is formed of aluminum or other materials having a low melting point.

As described above, the complete flattening of the wiring is a very difficult technological problem and is still under development, i.e., it is not applicable to memory devices and the like in practice.

The production of high integrated DRAMs has the following difficulties, as described in Japanese Unexamined Patent Publication (Kokai) No. 5-299599, for example. High integrated DRAMs unavoidably require an increased height of capacitor electrodes to provide an increased memory cell capacity, resulting in a significantly increased difference in height between a memory cell area and a peripheral circuit area. Moreover, because high integration involves refining of device patterns, the focus depth allowance in a photolithography is decreased when forming conductor patterns extending across the memory cell area and the peripheral circuit area. The combined increased height difference and decreased focus depth allowance causes significant difficulty in forming the conductor patterns.

To eliminate the difficulty, the above-recited Japanese Unexamined Patent Publication (Kokai) No. 5-299599 proposed a process in which, after a memory element or capacitor is formed, a first insulating layer remains in a peripheral circuit area and a second insulating layer is then formed to fill a boundary region between the memory cell area and the first insulating layer.

The proposed process, however, disadvantageously requires additional steps including a photolithographical process so that the first insulating layer selectively remains in the peripheral circuit area alone, which unavoidably raises the production cost.

K. Sagara et al., in "1992 Symposium on VLSI Technology Digest of Technical Papers", pages 10–11 proposed a "recess structure" as another solution to reduce the difference in height between a memory cell area and a peripheral circuit area, in which the level of the semiconductor substrate is preliminarily lowered in the portion in which a memory cell array is formed.

Also in this case, however, additional photolithographical process steps are necessary to reduce the height of a memory cell array, which consequently raises the production cost. Moreover, there is also a disadvantage that field oxide layers, gate electrodes, bit lines, etc., must be formed by patterning over the preliminary formed memory cell area having the reduced height and the peripheral circuit area having an ordinary height, so that the focus depth is reduced by the height difference preliminarily provided.

SUMMARY OF THE INVENTION

The object of the present invention is to provide a semiconductor device, such as DRAMs and SRAMs, and a process for producing same, in which flattening is sufficiently carried out for allowing a high precision patterning of wiring running above the memory cell area and the surrounding circuit area even when there is a large step between these areas.

To achieve the object according to the first aspect of the present invention, there is provided a semiconductor device comprising:

a semiconductor substrate having a memory cell area and a circuit area surrounding the memory cell area with a boundary area interposed therebetween;

a first conductive layer covering the memory cell area and extending onto the boundary area;

a first insulating layer covering the surrounding circuit area and part of the extended portion of the first conductive layer;

a second insulating layer covering the first insulating layer and the first conductive layer;

a throughhole formed through the first and second insulating layers; and a second conductive layer electrically connected with another conductive layer via the throughhole and extending from the memory cell area to the surrounding circuit area.

According to the second aspect of the present invention, there is also provided a process of producing a semiconductor device, the process comprising the steps of:

defining a first area and a second area with a boundary area therebetween on a semiconductor substrate;

forming a first electronic element on the first and second areas;

forming a second electronic element only on the first layer;

forming a first conductive layer extending from the first area to the boundary area;

forming a first insulating layer entirely on the substrate;

removing the portion of the first insulating layer that covers the first area, and thereby, exposing the first conductive layer;

forming a second insulating layer entirely on the substrate;

selectively removing the first and second insulating layers to form a throughhole; and forming a second conductive layer extending from the first area to the second area.

During etching for removing the first insulating layer and thereby exposing the first conductive layer, termination of the etching is detected by the first conductive layer.

A boundary area is provided between a memory cell area and a surrounding circuit area on a semiconductor substrate; a first conductive layer covers the memory cell area totally and the boundary area; and a first insulating layer covers the portion of the first conductive layer that is located on the boundary layer partially and the surrounding circuit area totally. Thus, the first conductive layer resides in the surrounding circuit area and the portion of the boundary area that adjoins to the surrounding circuit area, but does not reside in the memory cell area or the portion of the boundary area that adjoins to the memory cell area. This arrangement increases the height of the area on the substrate that surrounds the memory cell area by an increment corresponding to the thickness of the first insulating layer so as to cancel or offset the difference in height between the memory cell area and the surrounding circuit area. Thus, the first insulating layer has a thickness in accordance with the height of the electronic element such as a capacitor formed in the memory cell area.

The second insulating layer is provided to cover the first insulating layer and the portion of the first conductive layer that is not covered by the first insulating layer, so as to cancel or offset the step due to the memory cell height, thereby achieving a desired flattening.

Before forming of the second insulating layer, the portion of the boundary area that adjoins to the memory cell area is concave with respect to the surrounding region, because neither the first insulating layer nor an electronic element such as capacitor is formed in this portion. The size of the boundary area should be determined so that the concavity is fully filled with the material of the second insulating layer.

Typically, the memory cell is composed of a transfer transistor and a capacitor.

The process according to the second aspect of the present invention defines, on a semiconductor substrate, a first area, a second area and a boundary area between the former two, forms a first electronic element in the first and second areas, and forms a second electronic element only in the first area. Typically, the first electronic element is an element with a small height such as a MOS transistor and the second electronic element is an element with a greater height such as a capacitor.

The first conductive layer extends from the first area to the boundary area. Typically, the first conductive layer is formed as one electrode of a capacitor.

After forming the first insulating layer covering entirely the substrate area, the portion of the first insulating layer that covers the first area is removed to expose the underlying first conductive layer. In this process step, termination control of the etching for removing the first insulating layer is easily effected by the first conductive layer and no complicated control of the etching is required. This provides one of the most significant advantages according to the present invention.

Preferably, a third insulating layer having etching property different from that of the first insulating layer is deposited on the first conductive layer. The material of the third insulating layer is selected so that undesired substances do not diffuse into the first insulating layer during heating for reflowing of the first and second insulating layers. This arrangement enables detection of etching termination to be easily effected by the third insulating layer formed on the first conductive layer during the process step of exposing the first conductive layer by the removal of the first insulating layer. The third insulating layer also acts as a protective film for preventing possible diffusion of any undesired substances from the first and/or second insulating layers to the first conductive layer during heating for reflowing the first and second insulating layers.

Typically, the first conductive layer is fabricated by sequentially depositing a polysilicon layer and a silicon nitride layer in that order; the first and second insulating layers are formed by forming silicon oxide layers containing impurities; the portion of the first insulating layer that covers the first area is removed by etching with a solution containing hydrofluoric acid to expose the first conductive layer; the first and second insulating layers are reflowed by a heat-treatment carried out after forming of the second insulating layer.

Memory devices are relatively simple in pattern such that substantial height difference only occurs between the memory cell area and the surrounding circuit area, and moreover, the heat treatment temperature is not rigidly limited because the reflow process is carried out prior to provision of wiring. The present invention takes advantage of this fact to solve the problem of flattening for wiring.

According to a preferred embodiment of the present invention, a memory cell area and surrounding circuit area with a boundary area interposed therebetween are first defined on a semiconductor substrate, a conductive layer pattern covering the memory cell area and extending to the boundary area is then formed, a first BPSG layer, for example, is formed entirely over the substrate and is then removed in the portion from the boundary area to the memory cell area, a second BPSG layer, for example, is formed all over the substrate, and both BPSG layers are reflowed by heat treatment.

The etching for removal of the first formed BPSG layer is very easily controlled because of the presence of the underlying conductive layer pattern, i.e., the etching is simply allowed to continue until the conductive layer is exposed.

This formation and etching of a BPSG layer easily flattens local unevenness and flattening all over the substrate is achieved without using SOG or other special materials.

According to the third aspect of the present invention, there is provided a semiconductor device, such as shown in FIGS. 7A to 7K, comprising:

a semiconductor substrate 301;

a memory cell area "A" and a surrounding area "B" having the uppermost surface located on a level lower than that of the memory cell area;

a band pattern layer 326 located on a level lower than the uppermost surface of the memory cell area "A" and disposed on a boundary area "C" provided between the memory cell area "A" and the surrounding area "B";

a first insulating layer 328 formed on the uppermost surface of the surrounding area "B" and covering the periphery of the boundary area "C"; and a second insulating layer 331 entirely covering the first insulating layer 328, the memory cell area "A" and the boundary area "C".

Preferably, the band pattern layer 326 is composed of polysilicon or silicon nitride; and the first and second insulating layers 328, 331 are composed of a silicon oxide layer containing impurities.

Typically, the memory cell area "A" includes a pattern of conductive layers 304, 308, 310, 311 and 312 composed of a plurality of layers; and the surrounding area "B" includes a pattern of conductive layers 322 less in number than that of the memory cell area "A".

According to the fourth aspect of the present invention, there is provided a process of producing a semiconductor device, the process comprising the steps of:

forming a memory cell in a first area "A" of a semiconductor substrate 301 and a surrounding circuit 319 in a second area "B" of the semiconductor substrate, the latter having a height smaller than the memory cell (FIGS. 7A, 7B);

growing an etching stopper layer 326 entirely on the substrate 301 (FIG. 7C), and thereafter, selectively removing the portion of the etching stopper layer 326 that covers the surrounding circuit 319 (FIGS. 7C, 7A, 7B);

growing a first insulating layer 328 entirely on the substrate 301, and thereafter, forming on the first insulating layer 328 a mask 329 having a pattern overlapping the surrounding circuit 319 and the periphery of the etching stopper layer 326 (FIG. 7D);

etch-removing the portion of the first insulating layer 328 that is exposed through the mask pattern 329, and thereby, exposing the etching stopper layer 326 in the first area "A" (FIG. 7E);

selectively removing the portion of the etching stopper layer 326 that is not overlapped by the mask pattern 329 but is exposed (FIG. 7F); and exfoliating the mask 329 (FIG. 7G), and thereafter, depositing a second insulating layer 331 entirely on the substrate (FIG. 7H).

Typically, the etching stopper layer 326 is composed of polysilicon or silicon nitride: the first and second insulating layers 328, 331 are composed of a silicon oxide layer containing impurities.

According to the third and fourth aspects of the present invention, the first insulating layer 328 is provided only on the surrounding circuit 319 less in height than the memory cell; and the second insulating layer 331 is provided on the first insulating layer 328 and the memory cell. Thus, the surrounding circuit area "B" is imparted with an additional height by the first insulating layer 328 to substantially cancel the height difference with the memory cell. Moreover, as the second insulating layer 331 is provided both on the memory cell area "A" and on the surrounding circuit area "B" to flatten these areas, so that a resist layer applied on the second insulating layer 331 can have a uniform thickness.

This provides an improved precision of the patterns formed over both areas "A" and "B" and in contact with the underlying layer, by eliminating the conventional problem of focus depth during exposure for forming such patterns.

The etching stopper layer 326 consequently remains only in the boundary area "C" and in the form of a band, but not in throughholes in the surrounding circuit 319, thereby avoiding the shape defect which would otherwise occur when an etching stopper layer extrudes inside the throughholes.

During removal or etching of the first insulating layer 328 in the memory cell area "A", the etching stopper layer 326 provided in the memory cell area "A" protects the underlying layers from being undesirably removed.

It is a further object of the present invention to provide a semiconductor device and a process of producing the same, in which the difference in height between a memory cell area and a peripheral circuit area is eliminated to facilitate the formation of conductor patterns extending across the memory cell area and the peripheral circuit area, without causing an increase in the number of process steps.

To achieve the object according to the present invention, there is provided a semiconductor device comprising:

a semiconductor substrate having a memory cell area containing a memory cell composed of a capacitor element, and a peripheral circuit area obtaining a peripheral circuit for controlling the memory cell;

an insulating layer covering the peripheral circuit area and being absent in the memory cell area;

protective layers covering the top surfaces and side surfaces of word line conductor patterns and bit line conductor patterns in the memory cell area;

a contact hole having a circumference defined by one of the protective layers that covers the side surfaces of the word line conductor patterns in the memory cell area, the contact hole extending to a diffused region in the semiconductor substrate; and a storage electrode of the capacitor element being connected to a diffused region through the contact hole.

The protective layers act as an etching stopper during etching of the overlying insulating layers to prevent the underlying conductors from being etched.

The structure according to the present invention is advantageous in that the etching for selectively removing an insulating layer in a memory cell area alone can simultaneously form a contact hole self-aligned with word lines by a protective layer covering a word line conductor pattern, so that the difference in height between the memory cell area and the peripheral circuit area can be eliminated without any additional process steps for forming a contact hole necessary for a storage electrode.

Preferably, the insulating layer has a top surface lying on substantially the same level as a top surface of the storage electrode of the capacitor element so that planarization can be achieved with a minimum thickness of an overlying insulating layer.

According to the present invention, there is also provided a process of producing a semiconductor device, the process comprising the steps of:

(A) forming a field oxide layer on a semiconductor substrate to define thereon a memory cell area in which a memory cell composed of a capacitor element is formed, and a peripheral circuit area in which a peripheral circuit for controlling the memory cell is formed;

(B) forming, on the semiconductor substrate including the memory cell area and the peripheral circuit area, a word line conductor pattern having a top surface covered with a first protective layer;

(C) forming a pair of diffused regions in the semiconductor substrate by diffusing an impurity thereinto, using the word line conductor patterns and the first protective layer covering the top surface as a mask;

(D) forming a second protective layer covering the side surfaces of the word line conductor pattern;

(E) forming a first insulating layer on the semiconductor substrate including the word line conductor layer and the diffused regions;

(F) selectively removing the first insulating layer by etching in the memory cell area while leaving the word line conductor layer unremoved together with the first protective layer and the second protective layer covering the top surface and the side surfaces of the word line conductor layer and simultaneously forming a first contact hole having a circumference defined by the second protective layer covering the side surfaces of the word line conductor layer, the first contact hole exposing a counterpart of the pair of diffusion regions in the memory cell area; and (G) forming, in the memory cell area, a capacitor element composed of a storage electrode filling the first contact hole and being connected therethrough to the counterpart of the diffused regions, a counter electrode, and a dielectric layer effecting insulating and isolation between the storage electrode and the counter electrode.

The process according to the present invention is advantageous in that the difference in height between a memory cell area and a peripheral circuit area can be eliminated without additional process steps for forming a contact hole for a storage electrode in the memory cell area, because of the process sequence in which a first insulating layer is formed on a semiconductor substrate having a word line conductor pattern formed thereon, with the top and side surfaces covered with a protective layer and having diffused regions formed therein, and the first insulating layer is then removed selectively in the memory cell area alone, during which a contact hole is simultaneously formed having a circumference defined by a protective layer covering a side surface of the word line conductor pattern, and exposing a counterpart of the diffused regions in the memory cell area.

After forming a capacitor element, which is composed of a storage electrode filling the first contact hole and being connected therethrough to the counterpart of the diffused regions, a counter electrode, and dielectric layer effecting insulation and isolation between the storage electrode and the counter electrode, a second insulating layer covering the memory cell area and the peripheral circuit area is then formed to complete planarization.

Preferably, the first insulating layer has a top surface lying on the same level as the top surface of the storage electrode of the capacitor element.

BRIEF DESCRIPTION OF THE DRAWINGS

FIGS. 5A to 5F show a process sequence according to the first and second aspects of the present invention, in sectional view;

FIG. 10 shows a plan arrangement of a semiconductor memory device according to the present invention;

FIGS. 12(a) to 12(k) show a process sequence for producing the semiconductor device shown in FIG. 10 according to the present invention, in cross-sectional views; and FIGS. 13(a) to 13(m) show a process sequence for producing the semiconductor device shown in FIG. 11 according to the present invention, in cross-sectional views.

DESCRIPTION OF THE PREFERRED EMBODIMENTS

EXAMPLE 1

According to the first and second aspects of the present invention, a semiconductor device including a DRAM cell was produced through the following steps as shown in FIGS. 5A to 5F.

Figure 5A:
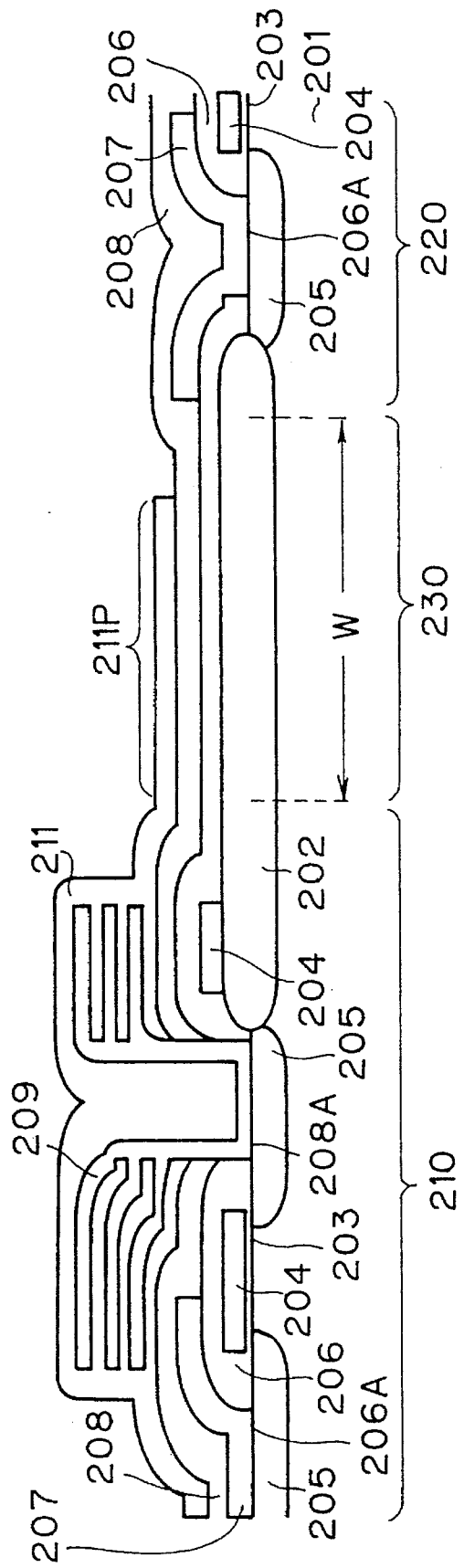

Step 1 (FIG. 5A)

A DRAM cell 210, having a fin-type capacitor, and a surrounding circuit 220 were formed on a silicon substrate 201 in a manner common to conventional semiconductor processes, except that a counter electrode pattern 211 of the cell 210 was formed so as to extend to a boundary area 230 provided between the areas 210 and 220. The boundary area 230 had a thickness (W) of 10 μm.

The structure shown in FIG. 5A has the following arrangement.

A field oxide layer 202 for isolation of elements is provided on the surface of a p-type silicon semiconductor substrate 201. A gate oxide layer 203 is formed in the active region defined by the field oxide layer 202. A gate electrode 204, composed of a first layer of polysilicon, extends from the gate oxide layer 203 to the field oxide layer 202. The gate electrode 204 functions, in the memory cell area, as the gate electrode and lead of a transfer transistor in a memory cell, and in the surrounding circuit area 220, as the gate electrode of a MOSFET.

n-type diffusion layers 205 are formed by using the gate electrode 204 and the field oxide layer 202 as a mask to provide the source/drain regions of a MOSFET of the surrounding circuit and a transfer transistor of the memory cell.

A second polysilicon layer 207 has an electrical contact with the n-type diffusion layers 205 through contact holes 206A formed in an insulating layer 206 which covers the gate electrode 204 and the n-type diffusion layers 205. The second polysilicon layer 207 forms a bit line in the memory cell area 210, and in the surrounding circuit area 220, forms a pad layer, which will be described in detail later.

A fin-type storage capacitor electrode 209 is connected to the drain 205 of the transfer transistor in the memory cell through a contact hole 208A formed in an insulating layer 208 composed of laminated SiO$_2$/SiN layers and covering the second polysilicon layer 207. The storage capacitor electrode 209 is formed within the memory cell area 210 only. A counter electrode 211 is formed so as to cover a dielectric layer (not shown) which covers the storage capacitor electrode 209.

The gate electrode 204 was 1000 Å thick, the bit line was 1000 Å, the storage capacitor electrode was 3000 Å high in total (i.e., 500 Å thick fins triplicated with 500 Å spacings interposed), and the counter electrode was 800 Å thick. There was thus a height difference of about 5800 Å between the outermost or top surface of the memory cell area 210 and the lowest portion of the surrounding circuit area 220, in which no substantial patterns are formed.

In the following FIGS. 5B to 6B, reference numerals 202 to 209 are omitted for simplicity, as these numerals denote component members having no essential relationship with the present invention. These numerals can be seen in FIG. 5A.

Figure 5B:
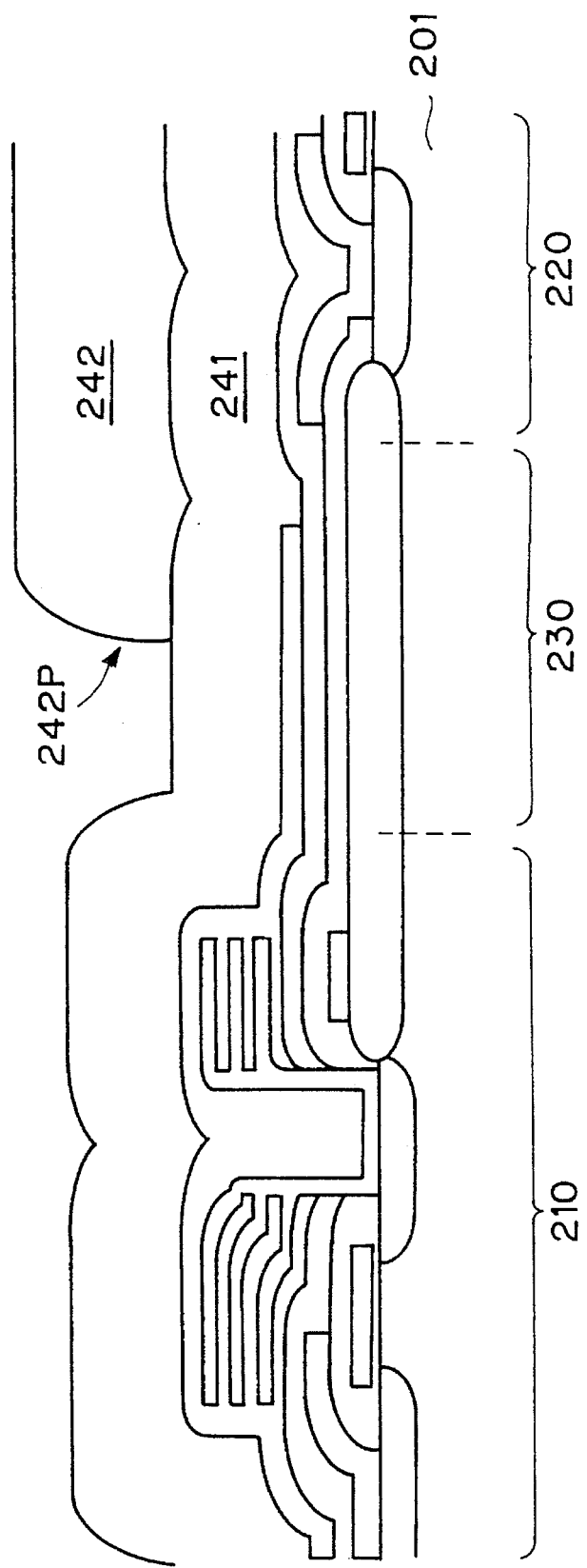

Step 2 (FIG. 5B)

A CVD process was performed to form a BPSG layer 241 with a thickness corresponding to the height difference between the memory cell area 210 and the surrounding circuit area 220, i.e., 5800 Å in this example. A photolithography process was then performed to form a resist pattern covering the surrounding circuit area entirely and the boundary area 230 partially, in such a manner that the resist pattern 242 has an end 242P located within the boundary area 230 and above the extended portion 211P of the counter electrode 211.

Figure 5C:
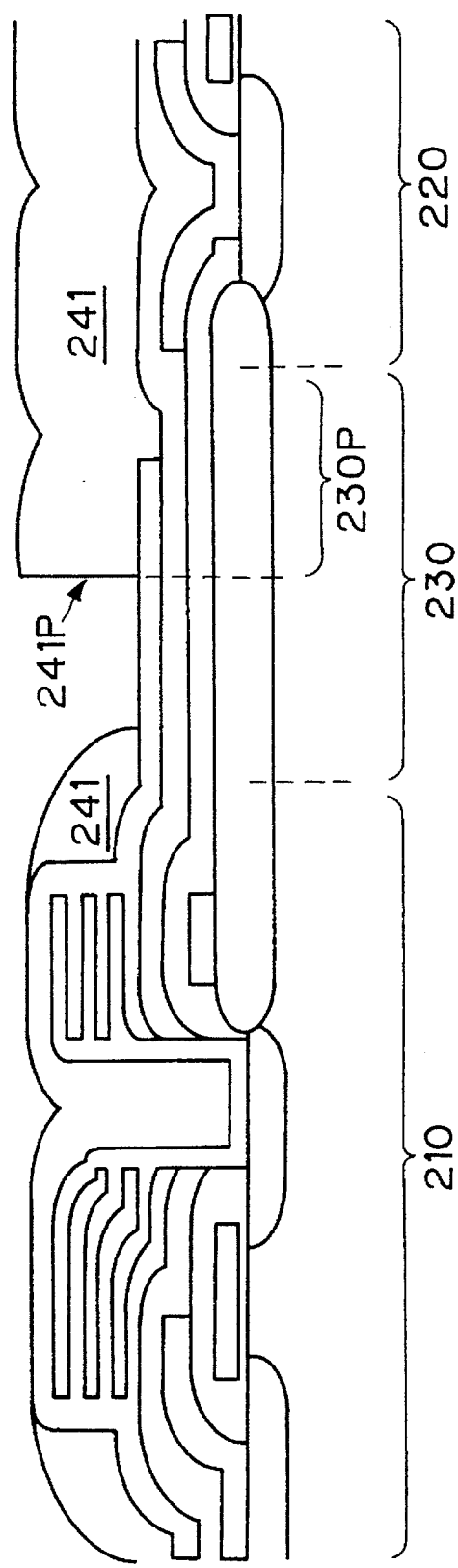

Step 3 (FIG. 5C)

The BPSG layer 241 was unisotropically etched by a CHF$_3$/He mixed gas by using the resist 242 as a mask, followed by removal of the resist 242. The BPSG layer 241 was thus patterned so as to cover the surrounding circuit area 220 and the portion 230P of the boundary area 230 that adjoins to the surrounding circuit area 220. Isotropic etching processes using HF (hydrofluoric acid) solutions, for example, may be used instead of the herein-used unisotropic etching. In either type of etching, termination of etching is easily controlled, because etching is automatically terminated at the extended portion 211P of the counter electrode 211 which is composed of polysilicon, for example.

When an RIE (reactive ion etching) is used, the termination of etching is advantageously detected by an emission spectrum of the plasma used, which changes upon exposure of the counter electrode 211. Such a detection is possible, as the counter electrode 211 covers entirely the memory cell 210 and occupies a large proportion of the substrate area.

The boundary area 230 can be sufficiently large so as to allow isotropic etching, for example, by HF to be carried out. In this case, the counter electrode 211 of polysilicon, for example, is not substantially etched by isotropic etching, and therefore, an excessive etching time would cause no problem.

Thus, it is a remarkable advantage of the present invention that etching termination can be controlled far more easily than in conventional flattening processes.

Step 4 (FIG. 5D)

A CVD process was performed to grow another BPSG layer 243 as thick as required to fill up the gap between the end 241P of the BPSG layer 241 and the memory cell 210, specifically 2500 Å in this example. However, it is not essential to fill the gap in this step, because a reflow process will be carried out in the next step.

Figure 5E:
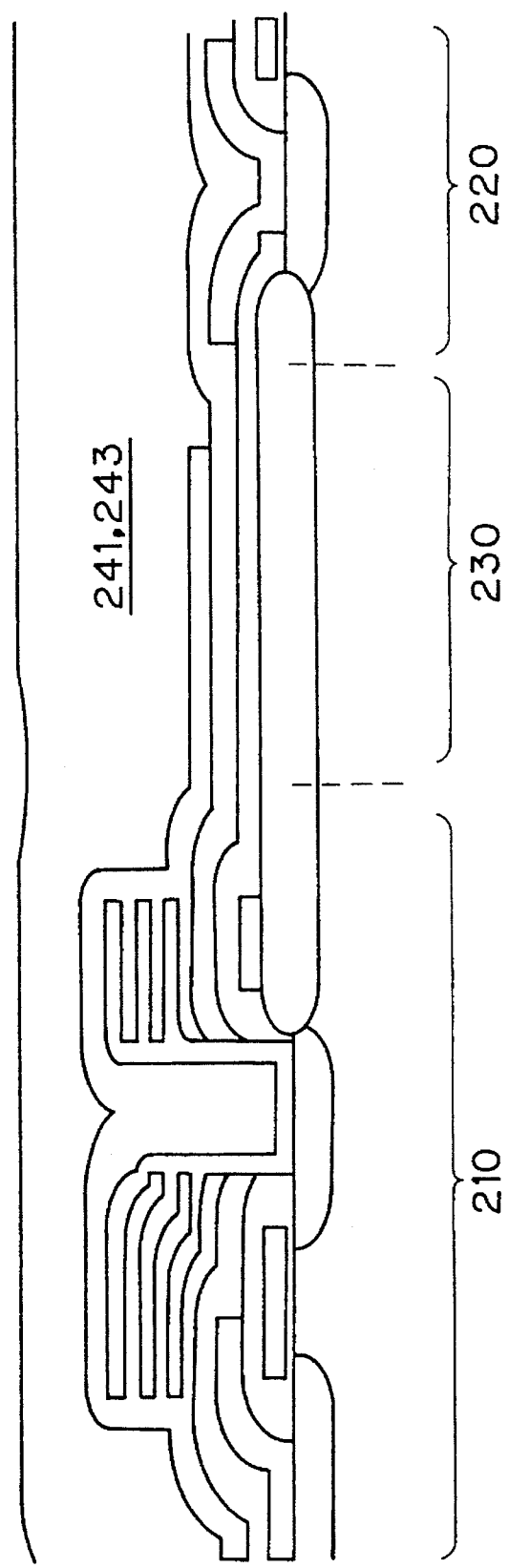

Step 5 (FIG. 5E)

A heat treatment was carried out at 850° C. for 20 min in a nitrogen gas atmosphere to reflow the BPSG layers 241 and 242, with the result that the substantial height difference between the memory cell 210 and the surrounding circuit 220 was eliminated, although a minute local unevenness remained. Such a minute unevenness can be flattened by selecting a suitable reflow condition.

Thus, because the reflow process can be adopted in the present invention, sufficient flattening is achieved by using BPSG or other common materials without using special materials such as SOG, and consequently, stable manufacture of devices can be realized. This is also a remarkable advantage of the present invention over conventional flattening processes.

Figure 5F:
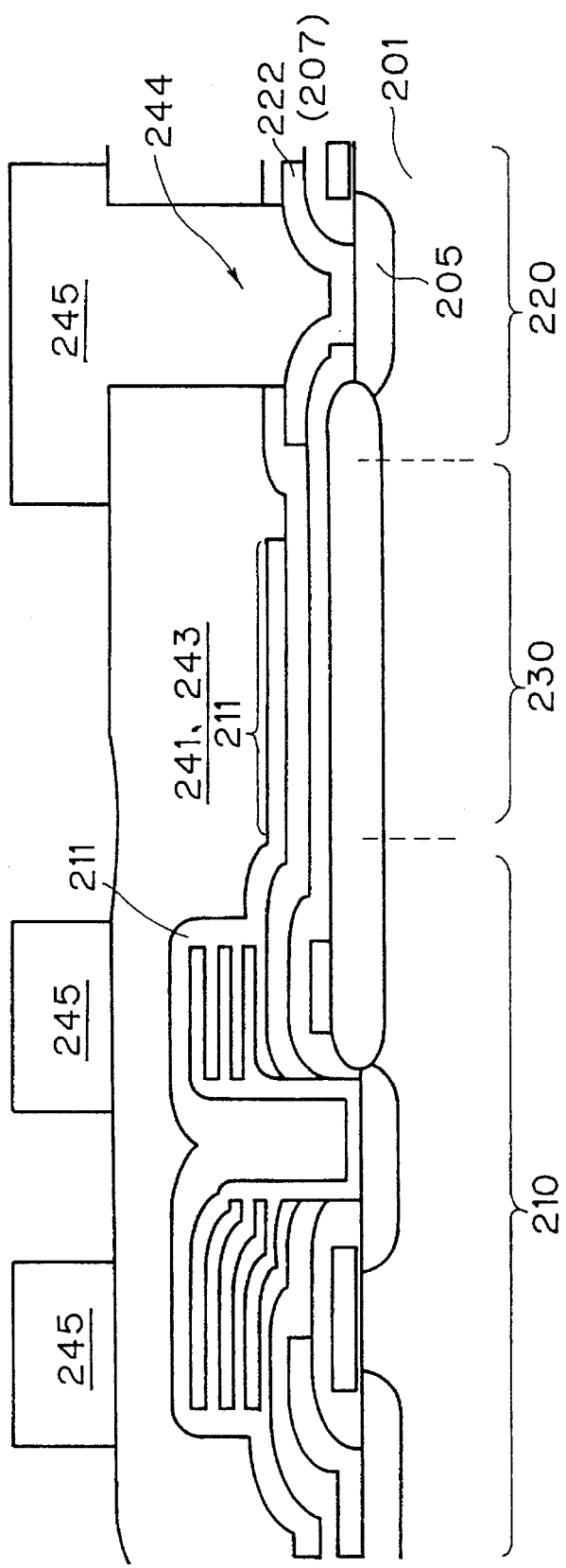

Step 6 (FIG. 5F)

A lithography process was performed to form a throughhole 244 for providing electrical connection to the overlying wiring. The throughhole 244 is usually formed in the surrounding circuit through a thick BPSG layer, and therefore, has a large depth, as shown in FIG. 5F. Considering this fact, a pad 222 of the same material as that of the overlying bit wiring is provided at the site where the diffusion region 205 meets the bit wiring material in the throughhole 244. Such a pad is fully described in Japanese Unexamined Patent Publication (Kokai) No. 1-120863. This pad is advantageous in that relatively large throughholes can be used and that any small change in the throughhole shape does not cause a short circuit to the neighboring gate electrodes.

A CVD process was then performed to sequentially deposit Ti, TiN, and W layers, thereby burying the throughhole 244, followed by a lithography process to pattern wiring 245. This patterning of the wiring 245 is performed over a flat surface without substantial unevenness to achieve an extremely high precision, eliminating the conventional problem of the focus depth allowance.

EXAMPLE 2

A semiconductor device having a DRAM cell was produced according to the present invention in the same process sequence as Example 1, except for the following modifications.

Figure 6A:
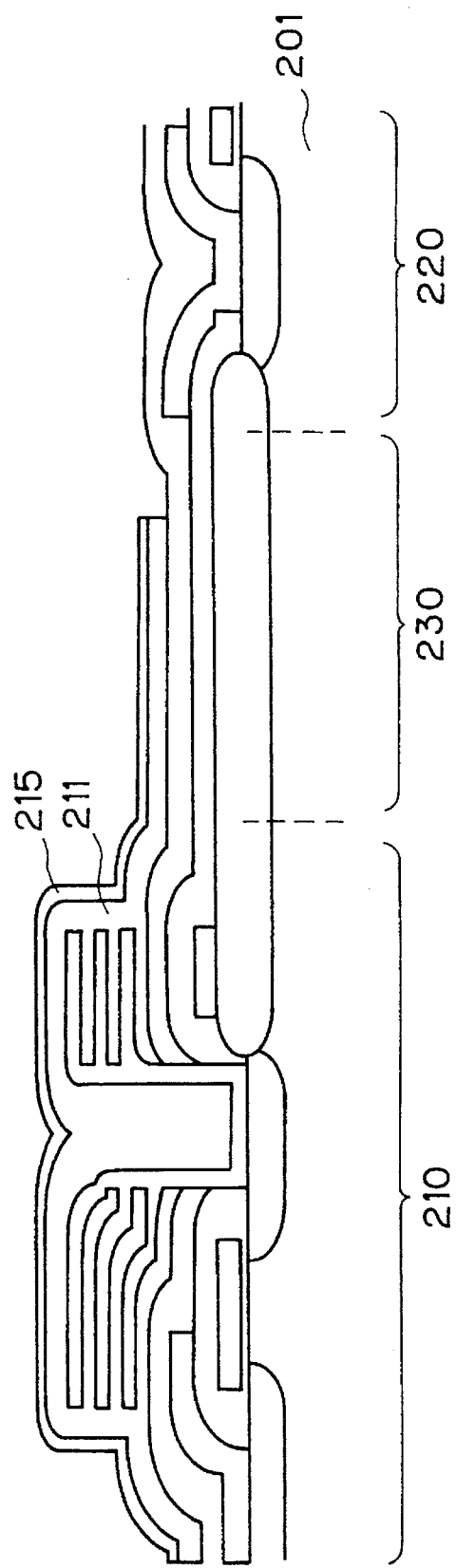
FIGS. 6A and 6B show another process sequence according to the first and second aspects of the present invention, in sectional view.

Step 1 (FIG. 6A)

Operations were performed in the same manner as in Example 1, except that a counter electrode 211 of polysilicon is coated with a silicon nitride layer 215 to form a laminate structure.

Figure 6B:
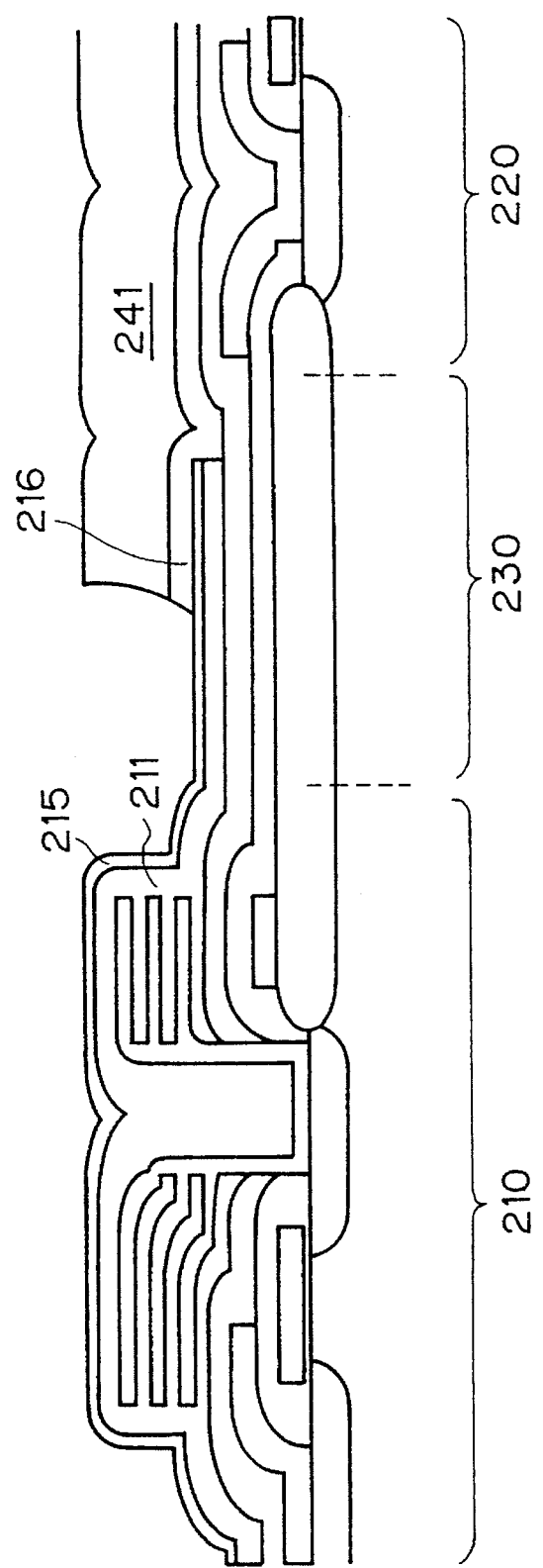

Step 2 (FIG. 6B)

A silicon oxide layer 216 was formed entirely over the substrate, followed by a CVD process as used in Example 1 to grow, on the layer 216, a BPSG layer 241 with a thickness corresponding to the height difference between the memory cell area 210 and the surrounding circuit area 220, i.e., 5800 Å. A photolithography process was performed to form a resist pattern 242 covering the surrounding circuit area 220 entirely and the boundary area 230 partially, in such a manner that the end 242P of the resist pattern 242 that is located within the boundary area 230 is located above the extended portion 211P of the counter electrode 211.

By using the resist as a mask, the BPSG layer 241 and the silicon oxide layer 216 were isotropically etched with an HF solution and the resist 242 was then removed. This patterned the BPSG layer 241 so as to cover the surrounding circuit area 220 and the portion 230P of the boundary area 230 that adjoins to the surrounding circuit area 220. During this etching operation, the silicon nitride layer 215 acted as an etching stopper so that the polysilicon layer 211 was not exposed.

Then, operations were performed in the same manner as used in Example 1 including the steps of flattening, forming throughholes, and forming wirings.

In this example, the polysilicon layer 211 is covered with the silicon nitride layer 215 and is therefore not brought into direct contact with the overlying BPSG layers 241 and 243.

This prevents the component elements such as B or P of these BPSG layers from diffusing into the polysilicon layer 211 during the heat treatment for reflow process. The impurity concentration of the counter electrode significantly affects the resistivity and crystal grain growth thereof, i.e., variation in the impurity concentration causes significant variation in these properties. This is fully described in Japanese Unexamined Patent Publication (Kokai) No. 1-186655. The embodiment of this example effectively prevents such an undesired phenomenon by a simple measure.

Regarding diffusion of impurities, the present invention is also advantageous in the following points.

In the present invention, a first BPSG pattern is not provided on the counter electrode. Under such a condition, an excessive etching would expose the silicon substrate 201 in the transistor region, causing destruction of the transistor because of the diffusion of impurities from BPSG. The flattening effected by a reflow process according to the present invention is also very effective to avoid such a dangerous phenomenon.

EXAMPLE 3

An embodiment according to the third and fourth aspects of the present invention is described.

Figure 1:
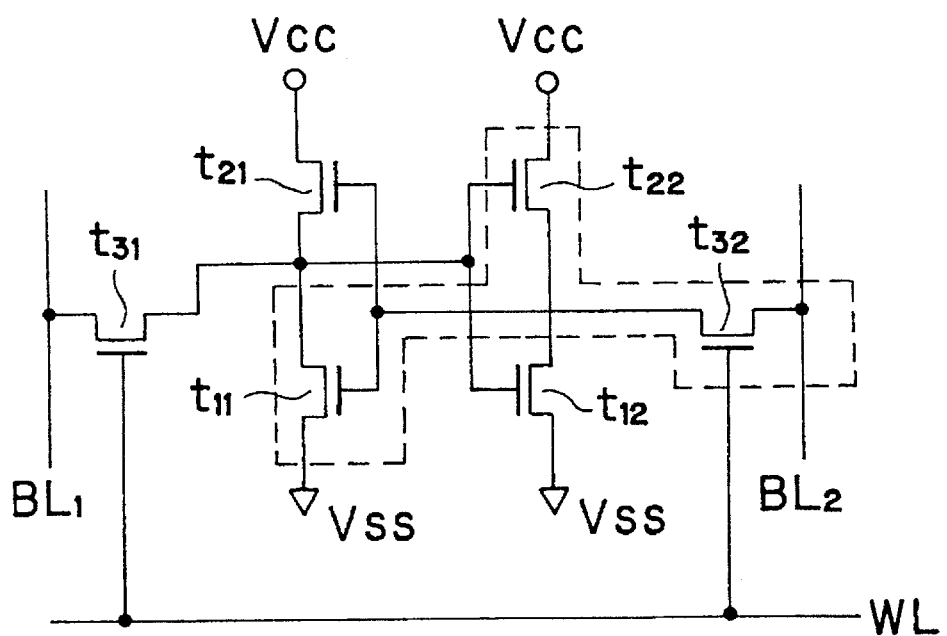
FIG. 1 shows an equivalent circuit corresponding to an SRAM.
Figure 2A:
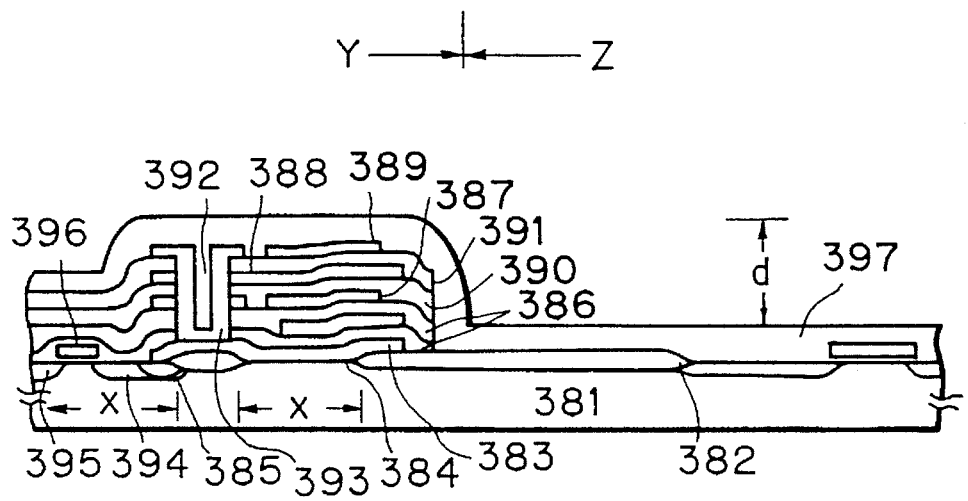
FIGS. 2A and 2B show a conventional arrangement of MOSFETs, in sectional view.
Figure 2B:
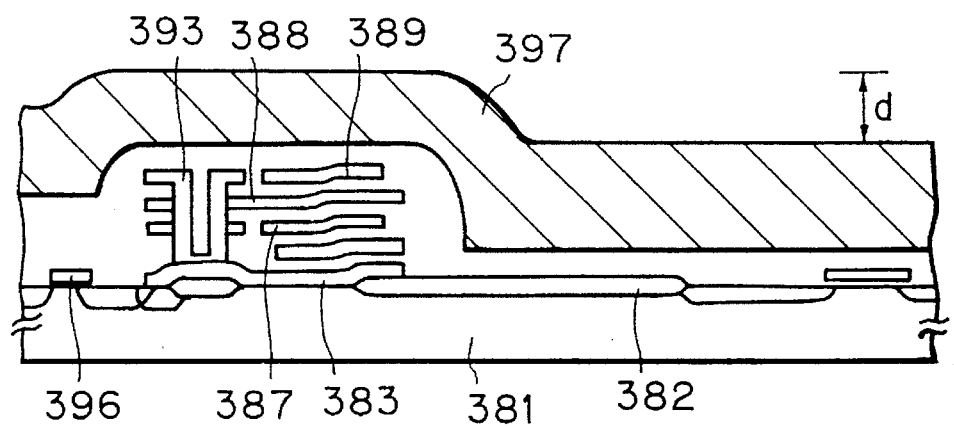

FIGS. 7A to 7K are sectional views of an SRAM cell of FIG. 1 in the portion surrounded by the broken line containing MOSFETS and the surrounding circuit.

Figure 7A:
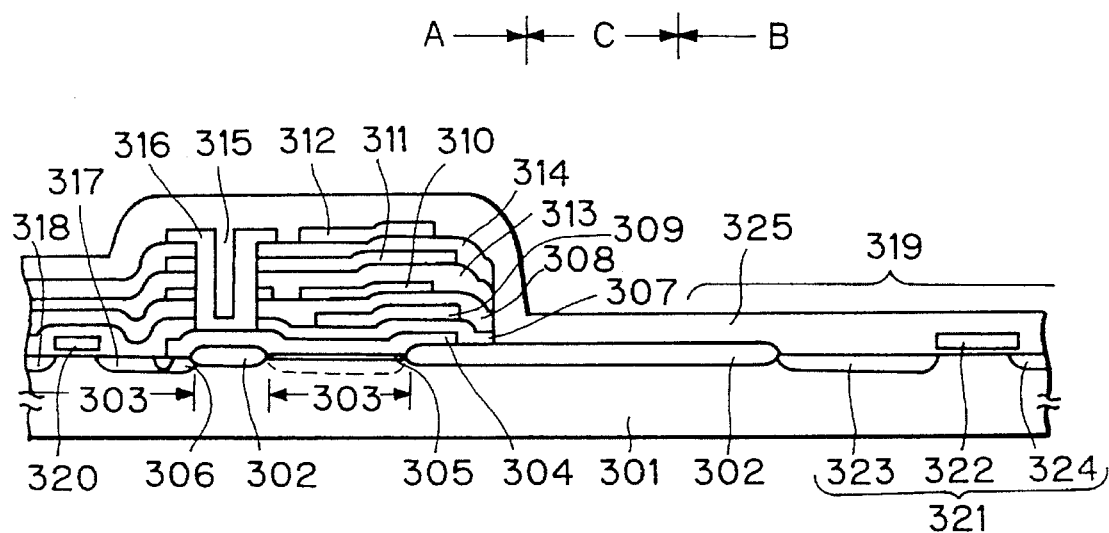
FIGS. 7A to 7K show a process sequence according to the third and fourth aspects of the present invention, in sectional view.

Step 1 (FIG. 7A)

In FIG. 7A, a silicon semiconductor substrate 301 has a memory cell area "A" containing a plurality of active regions 303 separated with a selectively oxidized layer 2 and has a surrounding circuit area "B" surrounding the memory cell area "A".

A driving MOSFET t11 and a transfer MOSFET t31 of the SRAM, both shown in FIG. 1, are formed in the active region 303 of the memory cell area "A".

A gate electrode 304 of the driving MOSFET t11 is formed on the semiconductor substrate 301 in the active region 303, with a gate insulating layer 305 interposed between the electrode 304 and the substrate surface. One end of the gate electrode 304 stepping over the selectively oxidized layer 302 is connected to the n-type impurity-doped layer 306 of the neighboring active layer 303. Not-shown n-type source/drain regions are formed in the active regions 303 located on both sides of the gate electrode 304.

Formed on an SiO$_2$ layer 307 covering the gate electrode 304 of the driving MOSFET t11 is a grounding conductor 308, on which a loading MOSFET t22 is formed with an SiO$_2$, layer 309 interposed between the MOSFET t22 and the conductor 308.

The loading MOSFET t22 is composed of a lower gate electrode 310, a polysilicon layer 311 and an upper gate electrode 312 with insulating layers 313 and 314 interposed therebetween. On the polysilicon layer 311, p-type source/drain regions and a channel region are provided.

Two gate electrodes (double gate) 310 and 312 are connected to p-type source/drain regions (not shown) of another loading MOSFET t21 of a similar structure.

A contact hole 315 is formed through SiO$_2$ layers 307, 309, 313 and 314 and the polysilicon layer 311, which are located above the gate electrode 304 of the driving MOSFET t11 stepping over the selectively oxidized layer 302 between the active layers 303, and inside the contact hole 315, a conductive layer 316 with a U-shaped section is formed on the side wall and bottom of the contact hole 315, so that the gate electrode 304 of the driving MOSFET t11 is connected to the polysilicon layer 311 which forms the source/drain regions of the loading MOSFET t22.

An impurity-introduced layer 316 of the active layer 303 connected to the leading edge of the gate electrode 304 of the driving MOSFET t11 is connected to one of the n-type source/drain regions 317 and 318 of the MOSFET t32 acting as a transmitter.

The above-described laminate structure composes part of an SRAM and a surrounding circuit 319, partially shown, is formed around the memory cell area "A".

The transfer MOSFET t32 has a gate electrode 320 formed on the substrate 301 with a gate insulating layer interposed therebetween. A MOSFET 321 has a gate electrode 322 and source/drain regions 323 and 324, which are formed in the surrounding are "B" of the substrate 301.

After the upper gate electrode 312 of the loading MOSFET t22 is formed, the subsequent process steps are carried out in the following manner.

A 100 nm thick SiO$_2$ layer is formed by a CVD process entirely on the substrate to cover the memory cell area "A" and the surrounding circuit 319.

Figure 7B:
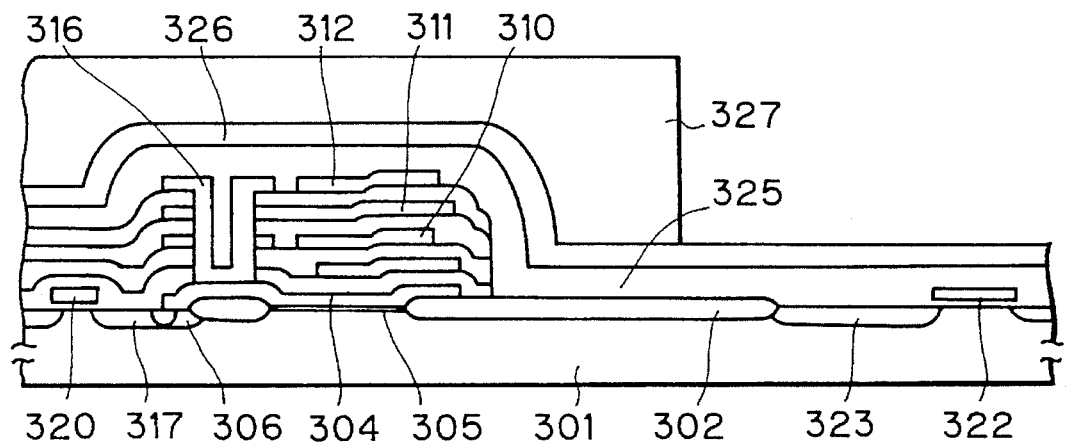

Step 2 (FIG. 7B)

Referring to FIG. 7B, a 100 nm thick polysilicon layer 326 is formed by a CVD process, and on the layer 326, a resist layer 327 is then applied, exposed to light and developed to form a resist pattern only covering the memory cell area "A" and the boundary area "C".

Figure 7C:
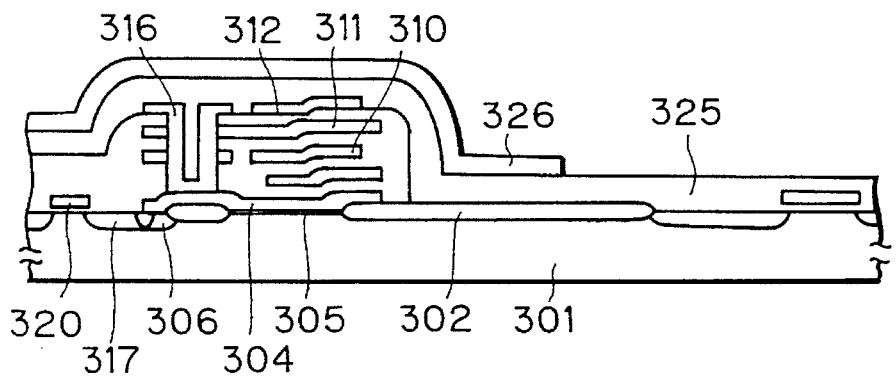

Step 3 (FIG. 7C)

A plasma etching is performed by using a CF$_4$/O$_2$ gas mixture to selectively remove the portion of the polysilicon layer 326 that is exposed from the resist 327. The resist 327 is then exfoliated. The resulting arrangement is shown in FIG. 7C.

Figure 7D:
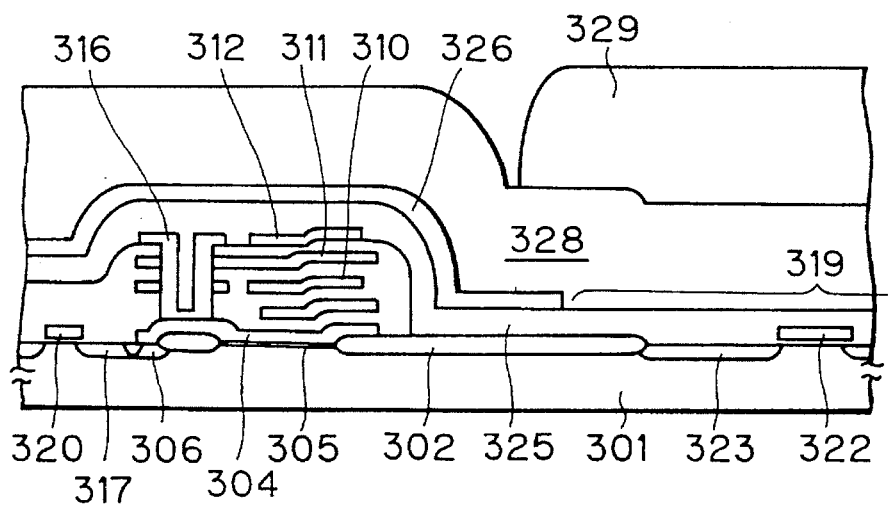

Step 4 (FIG. 7D)

Referring to FIG. 7D, a CVD process is carried out to form a BPSG (borophosphosilicate glass) layer 328 entirely over the substrate. The thus-formed BPSG layer 328 has a thickness corresponding to the height difference between the memory cell area "A" and the SiO$_2$ layer 325 covering the surrounding circuit 319, for example 500 nm.

A resist 329 is applied on the BPSG layer 328, exposed to light and developed to form a resist pattern covering the region of the BPSG layer 328 that is located above the surrounding circuit 319 and the circumferential portion of the polysilicon layer 326.

Figure 7E:
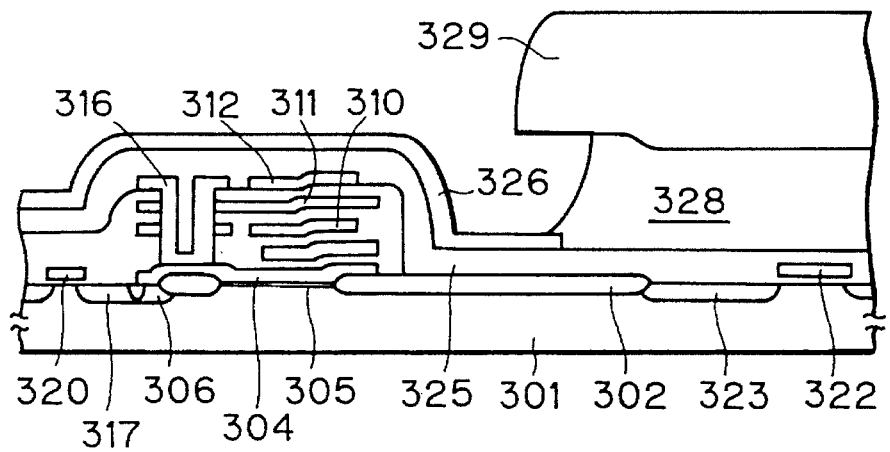

Step 5 (FIG. 7E)

Referring to FIG. 7E, the portion of the BPSG layer 328 that is exposed from the resist pattern 329 is removed by etching with hydrofluoric acid or the like. During this etching, the portion of the polysilicon layer 326 that is located in the memory cell area "A" functions as an etching stopper to prevent the underlying SiO$_2$ layer 325 from being etched.

A reactive ion etching process may be used instead, under the provision that the etching is carried out under a full over-etching condition to ensure no residue remaining on the stepped portions and the like of the region surrounding the memory cell area. Any residue would act as a mask during the later etching process, thereby causing the polysilicon layer 326 to remain at undesired sites.

Figure 7F:
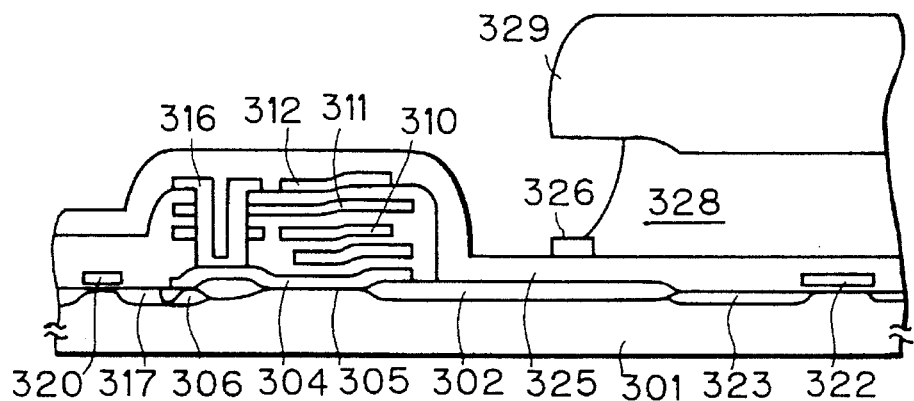

Step 6 (FIG. 7F)

Referring to FIG. 7F, a plasma etching process is carried out by using the resist pattern 329 as a mask to remove the polysilicon layer 326. A CF$_4$/O$_2$ gas mixture is advantageously used as an etching gas to prevent the SiO$_2$ layer 325 below the polysilicon layer 326 from being removed.

Figure 7G:
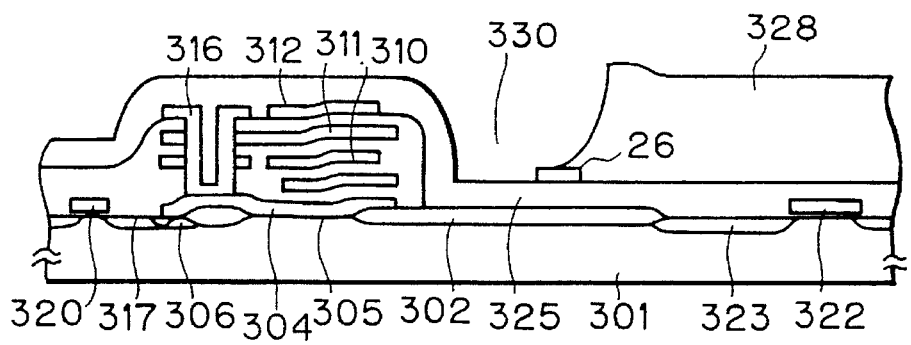

Step 7 (FIG. 7G)

The resist 329 is then exfoliated, as shown in FIG. 7G.

Figure 8:
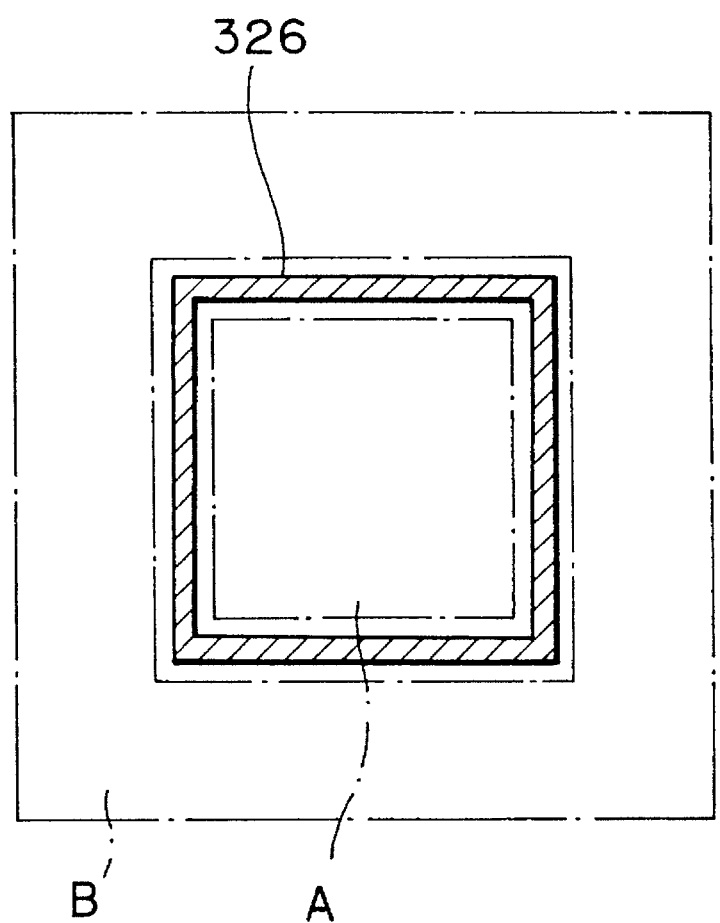
FIG. 8 shows an etching stopper layer retained around an SRAM region according to the present invention, in plan view.

In the boundary area "C", the polysilicon layer 326 remains below the end region of the BPSG layer 328, in the form of a belt zone surrounding the memory cell area "A" as can be seen in FIG. 8, but does not cause adverse effects during the subsequent process steps.

The top surface of the $SiO_2$ layer 325 covering the memory cell area "A" is on the same level as the top surface of the BPSG layer 328 in the surrounding circuit area "B", but a full flattening has not yet been achieved at this stage, because concavities 330 are formed in the boundary area "C" between the memory cell area "A" and the surrounding circuit area "B" and in the memory cell area "A".

Figure 7H:
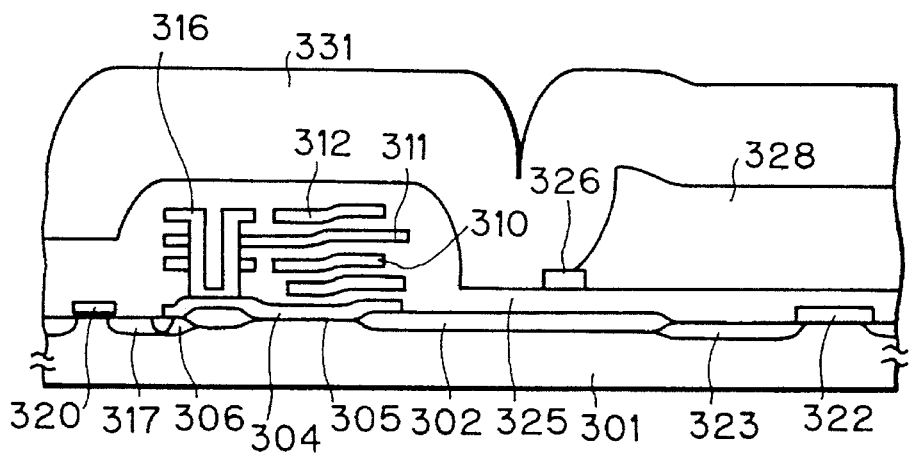
Figure 7I:
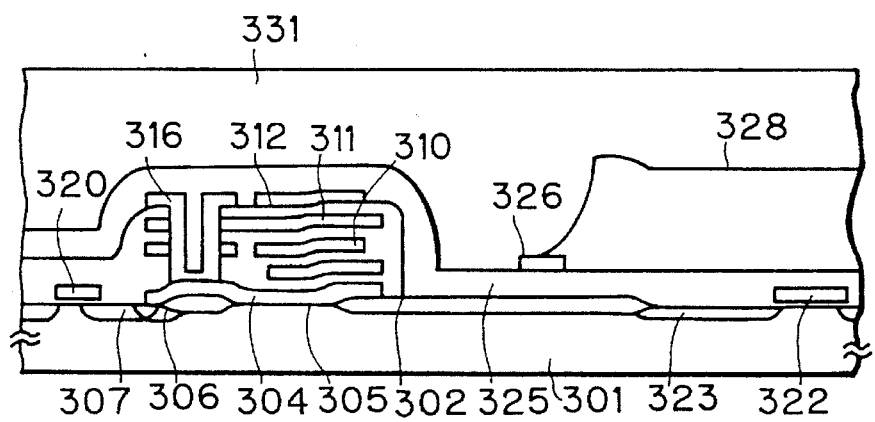

Steps 8 and 9 (FIGS. 7H and 7I)

A second BPSG layer 331 (400 nm thick) is formed by CVD process over the entire substrate 301 (FIG. 7H) and is then reflowed by a heat-treatment at 850° C. for 30 min to fill the concavities 330 with the second BPSG layer 331. This provides a full flattening of the second BPSG layer 331 as shown in FIG. 7I, i.e., no steps remain between the memory cell area "A" and the surrounding circuit 319.

Next step is to form a contact hole connecting wirings to the memory cell area "A" and the surrounding circuit 319.

Figure 7J:
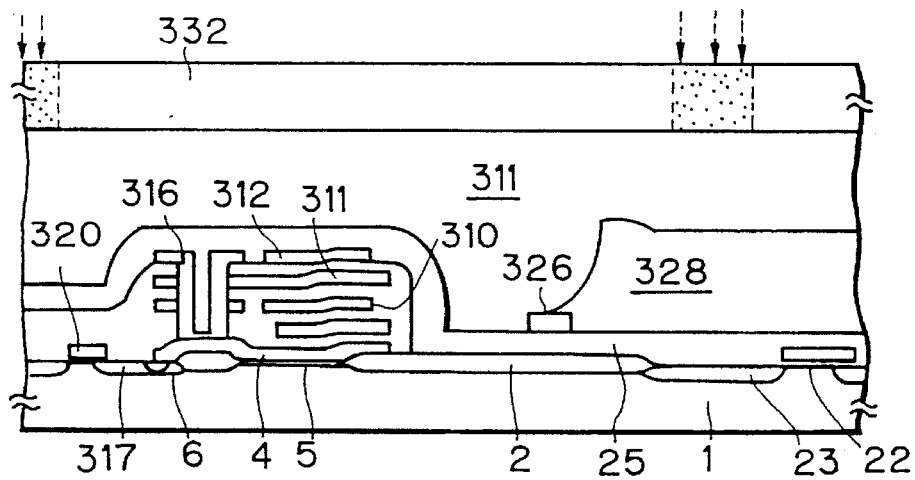

Step 10 (FIG. 7J)

To this end, a resist 332 is applied on the second BPSG layer 331, is exposed to light and is developed to form a mask pattern. Focus blooming does not occur during the exposure of the resist 332 and high precision patterning is achieved, because the second BPSG layer 331 has no unevenness or steps on the top surface thereof.

Figure 7K:
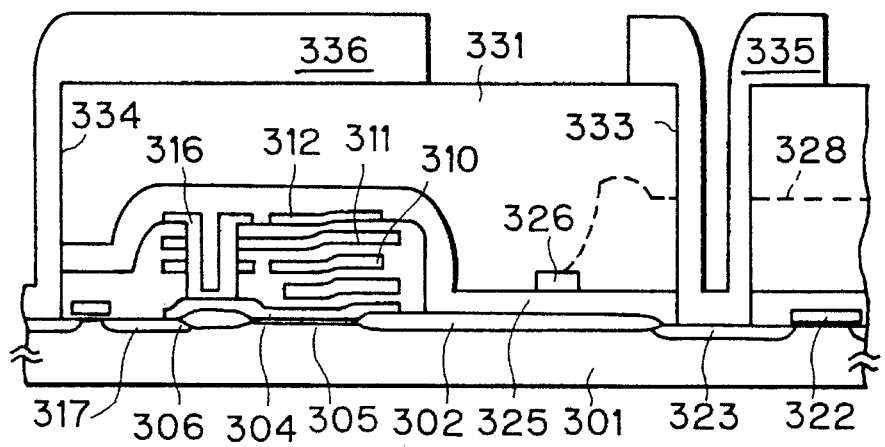

Step 11 (FIG. 7K)

The resist 332 is then used as a mask to open contact holes 333 and 334 through the BPSG layers 328 and 331 and the underlying $SiO_2$ layer 325 in the memory cell area "A" and the surrounding circuit 319. Metal conductor wirings 333 and 334 of tungsten are then formed through the contact holes 333 and 334.

Tungsten is difficult to wire-bond and has a higher resistivity than aluminum, particularly when forming long wiring. Therefore, a well-known two-layer metal wiring structure is then formed by coating entirely the substrate with an interwiring insulating layer of PSG (phosphosilicate glass) or the like, forming viaholes, and forming aluminum wirings.

The etching stopper layer 326 may be made of silicon nitride instead of polysilicon as used herein.

In this example, the etching stopper layer 326 is removed from the surrounding circuit 319 so as to only remain in the memory cell area "A" and the boundary area "C", as shown in FIG. 7C, for the following reason.

If the etching stopper layer 326 were also preserved on the surrounding circuit 319, the thus-preserved etching stopper layer 326 would be located under the BPSG layer 328 covering the surrounding circuit 319 and would remain in the final product.

Figure 9A:
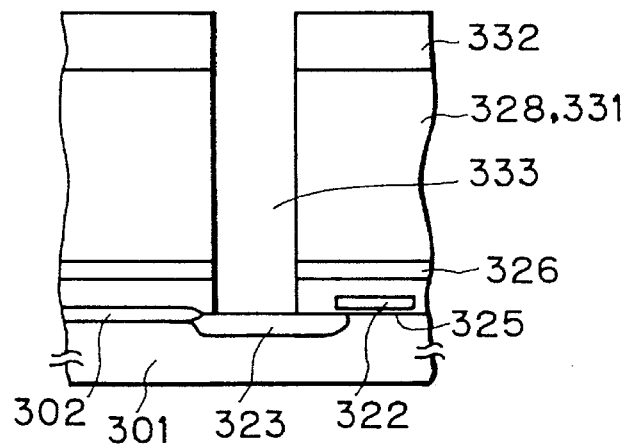
FIGS. 9A to 9C show a surrounding circuit area with an etching stopper layer unremoved, according to the present invention, in sectional view.

Then, to form a contact hole in the surrounding circuit 319, etching would be carried out by using the resist as a mask to remove the BPSG layers 328 and 331, the underlying etching stopper layer 326 and the further underlying $SiO_2$ layer 325, thereby forming a contact hole 333 with the underlying source/drain layer 323 exposed, as shown in FIG. 9A.

Figure 9B:
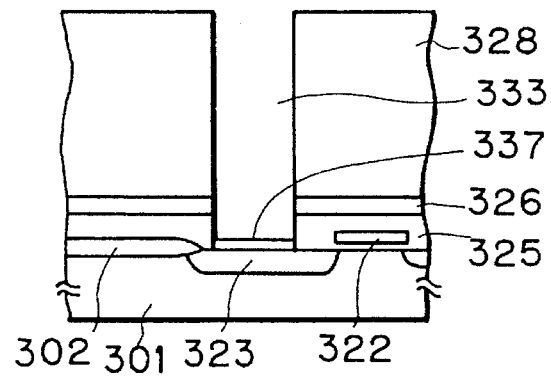
Figure 9C:
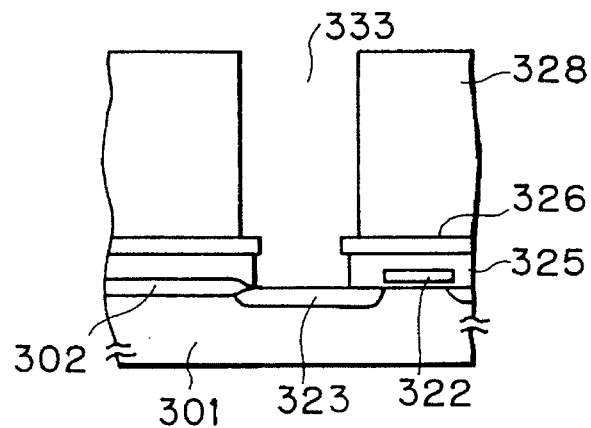

This etching would cause a natural oxide layer 337 to be formed on the surface of the source/drain region 323 as shown in FIG. 9B. Such a natural oxide layer must be removed by hydrofluoric acid. During this removal, the BPSG layers 328 and 331 and the $SiO_2$ layer 325 are etched in the transversal direction while the etching stopper layer 326, having a low etching rate, remains unetched and protrudes in the contact hole 333 as shown in FIG. 9C.

Sputtering of a wiring material into the contact hole 333, having such a protrusion, would cause incomplete coverage and lead to disconnection of the resulting wiring.

Therefore, the etching stopper layer 326 in the surrounding circuit 319 must be removed as shown in FIG. 7C to avoid the above-mentioned problem which would occur when the etching stopper is simply deposited.

Figure 3A:
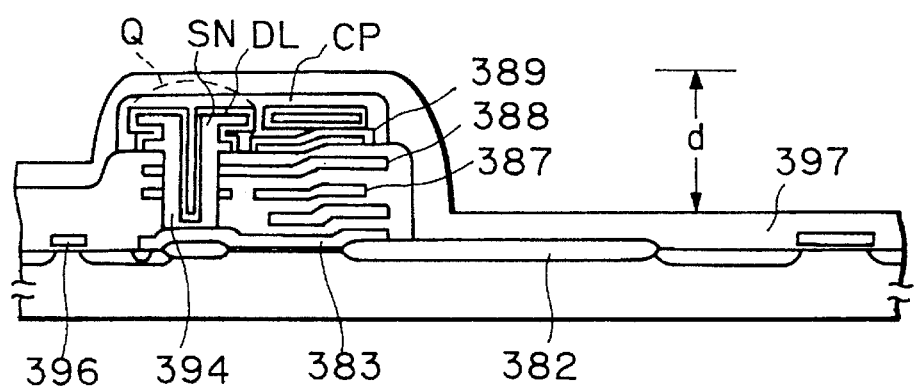
FIGS. 3A and 3B show another conventional arrangement of MOSFETs, in sectional view.
Figure 3B:
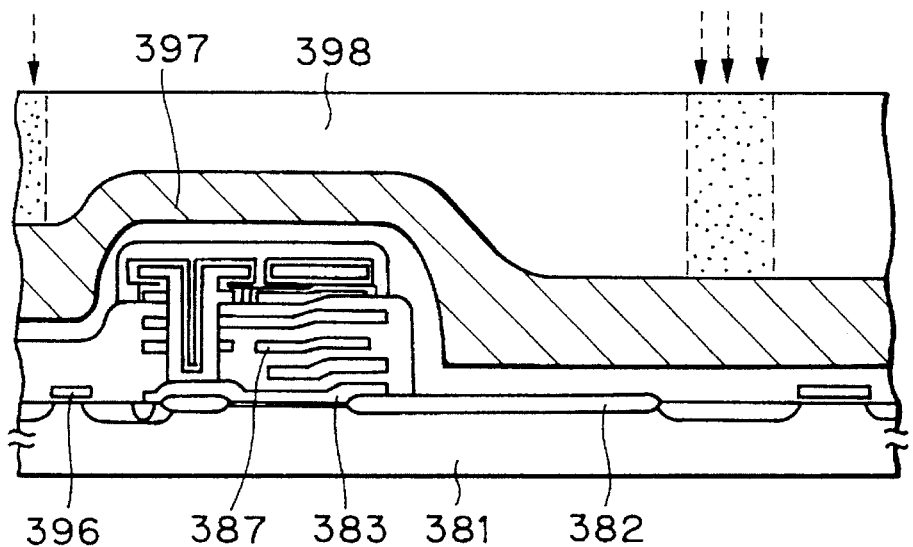
Figure 4A:
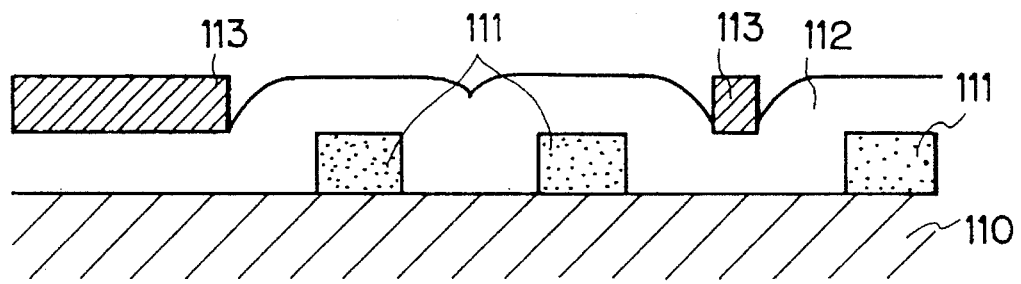
FIGS. 4A to 4C show the conventional process sequence, in sectional view.
Figure 4B:
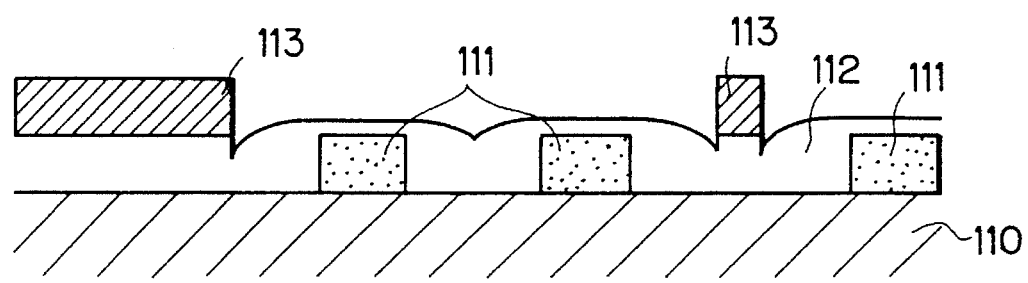
Figure 4C:
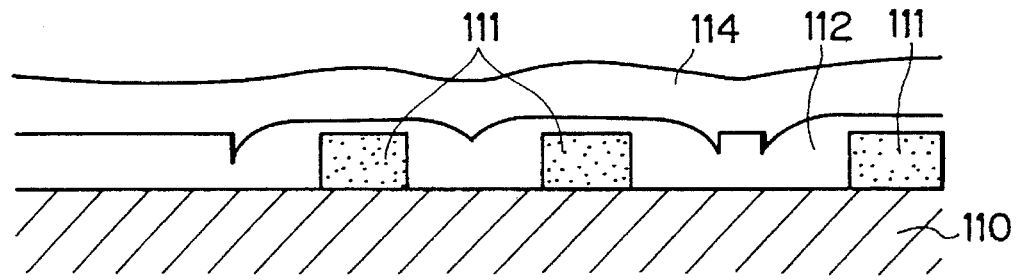

When an SRAM structure has a capacitor for eliminating the α-rays soft errors as shown in FIGS. 3A and 3B, the same result can be obtained by adopting the above-mentioned process steps from forming of the etching stopper layer 326 to depositing of the second BPSG layer 331.

As described above, the present invention forms a first insulating layer only on the surrounding circuit which is lower than the memory cell and deposits a second insulating layer on the first insulating layer and the memory cell, so that the surrounding circuit area has an increased height and is substantially as high as the memory cell. Moreover, the second insulating layer is formed on the memory cell area and the surrounding area to flatten these areas, so that a resist layer formed on the second insulating layer has a uniform thickness.

This advantageously improves the pattern precision by solving the problem of the focus depth encountered during forming of patterns running above and across these areas while being in contact with the underlying layer.

The etching stopper layer is present in the form of a belt and only in the boundary area, so that the etching stopper layer does not transversely protrude in throughholes, and thereby, shape defects do not occur.

During removal of the first insulation layer in the memory cell area, the etching stopper layer, which is present just below the region to be removed, prevents excessive etching of the underlying layers.

The present invention provides a semiconductor device, such as DRAMSs and SRAMs, with a sufficient flattening for ensuring high precision patterning of wirings running over and across the memory cell area and the surrounding circuit area having a large step or height difference therebetween. The height difference between these areas is thus eliminated to ensure forming of fine patterns. The α-rays soft errors are prevented by an increased memory cell capacity, so that high speed operation is fully achieved in contrast to the conventional art in which ECC is used for the same purpose.

According to a preferred embodiment of the present invention, there is provided an advantageous process of forming contact holes in a memory cell area that are necessary to electrically contact a storage electrode of a capacitor element, word lines, etc., with diffused regions formed in a semiconductor substrate.

From the view point of advanced integration and refinement of devices, it is desirable that bit lines and word lines have a minimum width and space resolvable in a photolithographical process. So long as an ordinary photolithographical process is used, contact holes for bit lines, etc., of course cannot be less than the resolvable minimum size, too.

When both the bit line width and the contact hole diameter have the same minimum value mentioned above, it is unavoidable that misalignment which may occur upon patterning thereof causes a photoresist pattern to fail to provide a mask for completely covering an area to be masked and the area is not protected but is undesirably etched. Therefore, it was conventionally impossible to realize an advanced refinement using the photolithographically resolvable minimum value.

According to a preferred embodiment of the present invention, there are provided the following two processes for forming a bit line contact hole, which solves the above-mentioned conventional problem and realizes an advanced refinement in which word lines and bit lines are formed with a size as small as the photolithographically resolvable minimum value.

The first process for forming a bit line contact hole according to a preferred embodiment of the present invention makes it possible to form a contact hole having a diameter far smaller than the photolithographically resolvable minimum value, by the feature that, after the lower half of the first insulating layer is formed in the step (E) and before the upper half thereof is formed, the following steps (1) to (4) are performed:

(1) forming, in the lower half of the first insulating layer, openings having a depth smaller than the thickness of the lower half of the first insulating layer in a portion above the other counterpart of the pair of diffused regions of the memory cell and in a portion above a gate electrode of the peripheral circuit area;

(2) forming a silicon oxide layer on the lower half of the first insulating layer;

(3) anisotropicaly etching the silicon oxide layer entirely so as to leave the silicon oxide layer in a ring form unremoved on a bottom circumferential corner of the openings and to form second contact holes extending from the bottoms of the openings to the other counterpart of the pair of diffused regions and to the gate electrode, the second contact holes having a side wall composed of the lower half of the first insulating layer and an upper end composed of the silicon oxide layer in a ring form, and the second contact holes having a diameter regulated or defined by the ring to be smaller than a width of a bit line; and (4) forming, in the memory cell area, a bit line conductor pattern connected to the other counterpart of the pair of diffused regions through one of the second contact holes and, in the peripheral circuit area, a gate electrode extension pad connected to the gate electrode through one of the second contact holes, the bit line conductor pattern and the gate electrode extension pad having their top and side surfaces covered with a third protective layer.

The silicon oxide layer is left unremoved in a ring form to regulate an effective etching diameter, so that a bit line contact hole has a diameter far smaller than the width of the bit line. This is extremely advantageous in that a contact hole can be formed with a diameter smaller than the width of word line and bit line even when the width has a photolithographically resolvable minimum value. Further details will be described in Example 4.

The second process for forming a bit line contact hole according to a preferred embodiment of the present invention makes it possible to form a contact hole having a diameter far smaller than the photolithographically resolvable minimum value, by the feature that, after the lower half of the first insulating layer is formed in the step (E) and before the upper half thereof is formed, the following steps (1) to (7) are performed:

(1) forming a thin protective layer on the lower half of the first insulating layer;

(2) forming a second insulating layer on the thin protective layer;

(3) forming a second contact hole extending through the lower half of the first insulating layer, the thin protective layer, and the second insulating layer to expose the other counterpart of the pair of diffused regions in the memory cell area, the second contact hole having a bottom circumference defined by the second protective layer covering the side surfaces of the word line conductor pattern, and the second contact hole having an opening diameter larger than a width of a bit line conductor pattern;

(4) forming a conductor layer entirely over the semiconductor substrate;

(5) forming a fourth protective layer effective in etching of the first insulating layer and the second insulating layer entirely over the conductor layer;

(6) forming a first photoresist pattern for defining the bit line conductor pattern at the second contact hole by a photolithographical process using a reduced light exposure controlled so that an mount of photoresist filling the second contact hole in a portion unmasked because of unavoidable misalignment upon exposure remains unremoved by later development and forms in the second contact hole a second photoresist pattern continuous with the first photoresist pattern; and (7) etching the conductor layer and the fourth protective layer together, by using the second photoresist pattern as a mask a bit line contact connected to the other counterpart of the pair of diffused regions through the second contact hole, the bit line contact being self-aligned with the second contact hole.

A photoresist pattern providing an etching mask upon forming bit lines is formed using an intentionally reduced light exposure so that the portion of the photoresist filling a contact hole formed beforehand is underexposed and is not removed by developing but remains to provide protection for the contact hole from etching necessary for forming the bit line.

This makes it possible that a bit line contact hole, even when having a diameter greater than the bit line width, can be formed without problems, i.e., preventing etching of undesired portions in the contact hole. Thus, even if word lines and bit lines are refined to a photolithographically resolvable minimum value, contact holes can be formed without problems. Further details will be described in Example 5.

According to another preferred embodiment of the present invention, there is provided a process of forming a storage electrode of a capacitor element, in which the steps (F) and (G) include the following substeps of:

(1) forming a lower half, and then an upper half, of the first insulating layer;

(2) selectively etching the first insulating layer in the memory cell area to form the first contact hole;

(3) forming a conductor layer entirely over the semiconductor substrate;

(4) forming a photoresist layer covering the conductor layer;

(5) exposing the photoresist layer to light with the peripheral circuit area masked, in a photolithographical process using a reduced light exposure controlled so that the photoresist layer remains unremoved upon later development not only in the peripheral circuit area, which is masked, but also in the first contact hole in the memory cell area, which is not masked; and (6) etching the conductor layer by using the photoresist remaining unremoved in the peripheral circuit area and in the first contact hole, to form a storage electrode in the form of a crown and self-aligned with the second contact hole.

In this process, because of the same principle discussed in the second process of forming a bit line contact hole, a thick photoresist layer is underexposed to remain unremoved in the contact hole in the unmasked memory cell area and the remaining photoresist is used as a mask upon etching of a conductor layer to leave the conductor layer in the contact hole alone, thereby forming a storage electrode self-aligned with the contact hole.

This makes it possible to omit a patterning step for forming a storage electrode in which exact size control is required. Further details will be also described in Example 5.

More preferably, the preferred process of forming a storage electrode further comprises the steps of: removing the photoresist layer; and then removing, by etching, part of the first insulating layer in contact with the outer side wall of the storage electrode in the form of a royal crown to expose part of the outer side wall of the storage electrode. This is advantageous in that the storage electrode contributes, on both sides in the peripheral portion of the crown form, to the memory capacity.

Thereafter, the following steps are performed:

sequentially forming a dielectric layer and a second conductor layer thereon entirely over the semiconductor substrate; and then removing, by etching, the dielectric layer and the second conductor layer together in the peripheral circuit area to form a capacitor element composed of the storage electrode in the form of a crown, a counter electrode made of the second conductor layer, and the dielectric layer which isolates and insulates the storage electrode and the counter electrode from each other.

Preferably, the first protective layer, which covers the top surface of the gate electrode in the peripheral circuit area, is thicker than the third protective layer, which covers the gate electrode extension pad connected to the gate electrode. This makes it possible that a single run of etching removes a protective layer on a gate electrode extension pad while a protective layer on a gate electrode is merely reduced in thickness and remains unremoved.

EXAMPLE 4

FIG. 10 shows a plan arrangement of a semiconductor memory device according to the present invention. Plural parallel word lines 13WL and 13G/WL are extending in a first direction and plural parallel bit lines 20BL are extending in a second direction transverse to the first direction. Symbol "13G" denotes a gate electrode made of the same layer 13 of which the word line 13WL is also made. The combined symbol "13G/WL" means that the word line 13WL provides a gate electrode 13G in the cross-section under consideration.

An active region ACT defined by broken lines intersects a bit line 20 BL over a region BLC (marked with "X") which provides a contact hole for the bit line 20BL. A storage electrode 24 (FIG. 12(k)) and the active region ACT have a contact hole STC therebetween in a space defined by the bit lines 20BL and the word lines 13WL. The word lines 13WL and the bit lines 20BL both have the same width and space of 0.4 µm, which is a photolithographical resolvable minimum value attainable at present.

FIG. 12(k) is a cross-sectional view along line A—A of FIG. 10. On a semiconductor substrate 10, there are provided a memory cell area M including a memory cell composed of a capacitor element and a peripheral circuit area S including a peripheral circuit for controlling the memory cell. An insulating layer 23 covers the peripheral circuit area S but does not exist in the memory cell area M.

The memory cell area M contains conductor patterns 13G, 13WL, 13G/WL and 20BL and the peripheral circuit area S contains 20PAD, with their top and side surfaces which covered with first protective layers (14, 21) and second protective layers (17, 22), respectively, both protective layers effectively acting as an etching stopper upon etching of the insulating layer 23.

The contact hole STC has a circumference defined by the protective layer 17 covering the side surfaces of the conductor patterns 13G and 13G/WL in the memory cell area M and extends to the semiconductor substrate 10. The storage electrode 24 of a capacitor element is connected to the semiconductor substrate 10 through the contact hole STC.

Figure 12D:
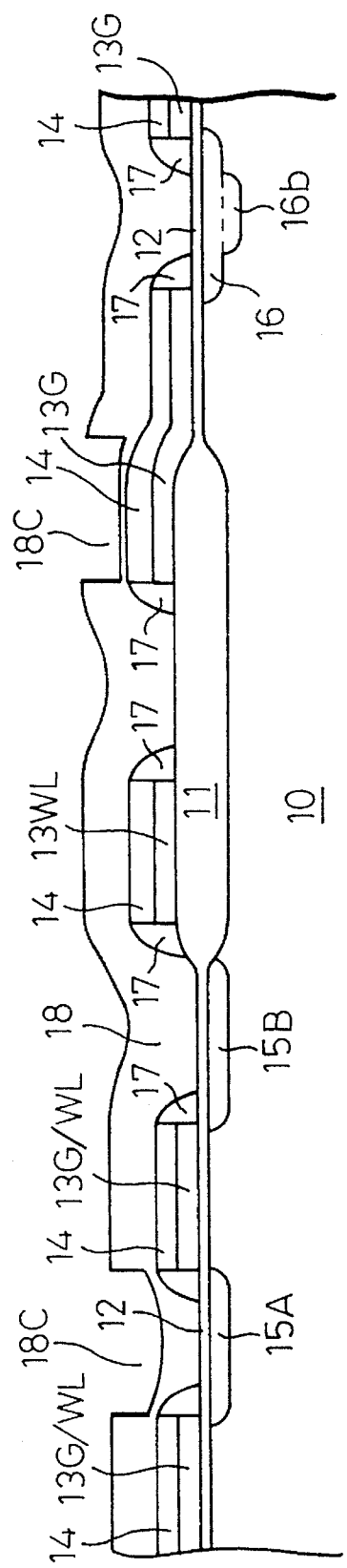

Referring to FIGS. 12(a) to 12(k), a process for producing the semiconductor device shown FIGS. 10 and 12(k) will be described below.

[Step 1] (See FIG. 1(a))

A field oxide layer 11 is formed on a semiconductor substrate 10 by a LOCOS process. The field oxide layer 11 acts as an element isolation region ISO and defines on both sides thereof active regions ACT.

A gate oxide layer 12 is then formed on the active regions ACT. The area extending from the center of the element isolation region ISO (or field oxide layer 11) to the active region ACT defined on the left side is used as a memory cell area M and the area extending from the center of the element isolation region ISO to the active region ACT defined on the right side is used as a peripheral circuit area S.

[Step 2] (See FIG. 12(b))

To form a conductor pattern for composing word lines and bit lines, a CVD process is performed to grow a 150 nm thick, phosphorus-containing poly-silicon layer 13 and thereon a 350 nm thick silicon nitride layer 14. By using a mask made of a photoresist pattern formed by an ordinary photolithographical process, the polysilicon layer 13 and the silicon nitride layer 14 are etched together to form a gate electrode 13G and word lines 13WL and 13G/WL having top surfaces covered with the silicon nitride layer 14.

By using the gate electrode 13G and the field oxide layer 11 as a mask, phosphorus (P) ions are implanted in the substrate 10 at an acceleration voltage of 20 keV and a dose of $2\times10^{13}$ cm$^{-2}$ to provide source/drain regions 15A and 15B of a memory cell transistor and a low impurity concentration region 16 of a peripheral circuit LDD.

[Step 3] (See FIG. 12(c))

A CVD process is performed to grow a 150 nm thick silicon nitride layer 17, which is then subjected to an anisotropic etching to form a side wall 17 of silicon nitride.

A photoresist layer (not shown) is formed to cover the memory cell area M and expose the peripheral circuit area S. By using this photoresist layer, the field oxide layer 11, the gate electrode 13G, and the side wall 17 as masks, As ions are implanted into the substrate 10 at an acceleration voltage of 20 keV and a dose of $4\times10^{15}$ cm$^{-2}$ to form a high impurity concentration region 16b of the peripheral circuit LDD.

[Step 4] (see FIG. 12(d))

A 300 nm thick insulating layer 18 of BPSG (borophosphosilicate glass), with or without an SiO$_2$ layer stacked therewith, is grown by a CVD process. Heat treatment is carried out at 850° C. for 15 min in a nitrogen gas atmosphere to reflow the BPSG layer 18 for planarization.

Openings 18C having a diameter of 0.5 μm and a depth of about 280 nm are formed by an ordinary photolithographical process in the BPSG layer 18 above the diffused region 15A providing a counterpart of source/drain regions of a memory cell transistor and above the gate electrode 13G of the peripheral circuit. The openings 18 do not reach the silicon nitride layers 14 and 17, which are thus not exposed but kept buried in the BPSG layer 18.

[Step 5] (See FIG. 12(e))

A 200 nm thick silicon oxide layer 19 is grown by a CVD process. The silicon oxide layer 19 is then entirely subjected to anisotropic etching to form a bit line contact hole BLC in the opening 18C. The bit line contact hole BLC exposes the top surface of the diffused region 15A providing a counterpart of the source/drain regions of the memory cell transistor and the top surface of the gate electrode 13G of the peripheral circuit.

The silicon oxide layer 19 is not removed by the anisotropic etching on the corner around the bottom circumference of the opening 18C, so as to regulate an etching area in the mass of BPSG layer 18 at a reduced value. This makes it possible to form a contact hole BLC having diameter far smaller than the diameter of the opening 18C, and far smaller than the width and the space of the bit lines of a photolithographically resolvable minimum value.

Specifically, the contact hole BLC has a final diameter of 0.1 μm obtained by subtracting a decrease (0.2 μm×2=0.4 μm in terms of diameter) by the thickness (200 nm=0.2 μm) of the side wall of the remaining oxide 19 from the diameter (0.5 μm) of the opening 18C, i.e., 0.5 μm−0.2 μm×2=0.1 μm. The value 0.1 μm is far smaller than the photolithographically resolvable minimum value of 0.4 μm.

When bit lines have a width of 0.4 μm, a covering allowance of 0.15 μm is ensured between a bit line and a contact hole and therefore there is no danger that the silicon substrate 10 around a bit line is undesirably etched during etching necessary for forming the bit line. If the silicon substrate is undesirably etched, a junction leakage occurs and the device performance is deteriorated. The embodiment of this example advantageously prevents the occurrence of such an undesirable phenomenon.

Moreover, word lines also have a width and space of 0.4 μm, so that an allowable alignment tolerance between the word line and the bit line contact hole is also 0.15 μm. If a word line is exposed in a bit line contact hole, a short circuit between the bit and word lines occurs. The allowance of 0.15 μm advantageously prevents this undesirable phenomenon.

In the cell layout shown in FIG. 10, there is an area of merely 0.4 μm which can be used for providing contact between a bit line and a counterpart of the source/drain regions while preventing short circuits between bit and word lines. Such a condition cannot be realized by an ordinary photolithographical process. The embodiment of this example can realize this condition because it can provide a fine contact hole smaller than a photolithographically resolvable minimum value.

Figure 12F:
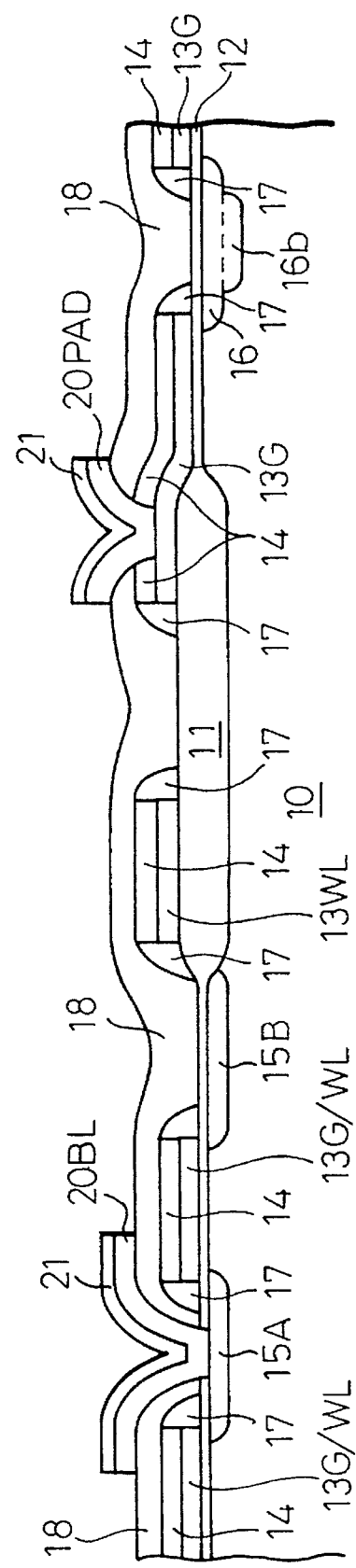

[Step 6] (See FIG. 12(f))

To form bit lines of the memory cell area M and the gate electrode extension pad of the peripheral circuit area S, a phosphorus-containing polysilicon layer (50 nm thick) and a tungsten silicide layer (120 nm thick) are sequentially formed by a CVD process to provide a laminate layer 20.

On the laminate layer 20, a layer 21 of silicon nitride (150 nm thick) or a laminate layer 21 of a silicon oxide layer (100 nm thick) and a silicon nitride layer (100 nm thick) is formed as a protective layer which acts as an etching stopper during etching of the BPSG layer.

Thereafter, the layers 20 and 21 are simultaneously patterned by an ordinary photolithographical process to form a bit line 20BL of the memory cell area M and a gate electrode extension pad 20PAD of the peripheral circuit area S, both having top surfaces covered with the layer 21 of silicon nitride or of silicon oxide/nitride laminate.

It should be noted that the layer 21 (150 nm or 200 nm thick) is thinner than the silicon nitride layer 14 (350 nm thick). This relationship is necessary in the later step 10 when the source/drain regions 16 and the gate electrode extension pad 20PAD are exposed in self-aligned with the gate electrode 13G.

Figure 12G:
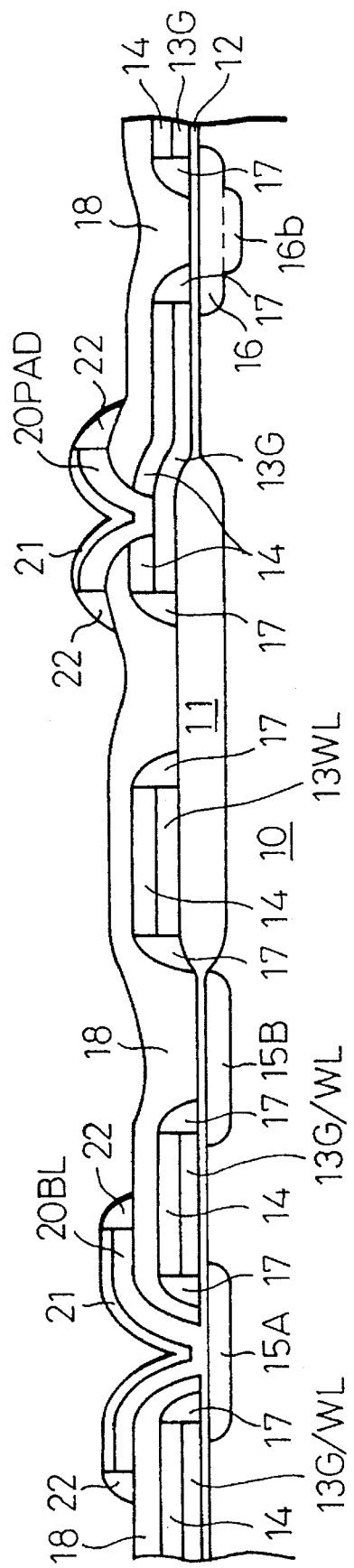

[Step 7] (See FIG. 12(g))

A 150 nm thick silicon nitride layer is grown by a CVD process and is then anisotropically ion-etched to form a silicon nitride side wall 22, which effectively acts as a protective layer or an etching stopper upon etching of BPSG layers.

[Step 8] (See FIG. 12(h))

A 500 nm thick BPSG layer 23 is grown by a CVD process, which is then reflowed for planarization by a heat treatment at 850° C. for 15 min.

A photoresist pattern covering the peripheral circuit area S is then formed by an ordinary photolithographical process.

By using this photoresist pattern as a mask, the BPSG layers 18 and 23 in the memory cell area M are etched, with a sufficient etching selectivity being kept relative to the silicon nitride layers 14, 17, 21, and 22, to expose the other counterpart 15B of the source/drain regions of the memory cell transistor, i.e., to form a storage electrode contact hole STC having a circumference defined by the protective layer 17.

[Step 9] (See FIG. 12(i))

A 700 nm thick phosphorus-containing polysilicon layer is formed by a CVD process and is then patterned by an ordinary photolithographical process to form a storage electrode 24 of a capacitor.

This patterning is done by anisotropic etching so as to provide the capacitor with a large area and it is difficult to etch the polysilicon in a recess surrounded by the word line 13WL and the bit line 20BL. To avoid this difficulty, this example uses a layout in which the storage electrode 24 is disposed over the recess and the portions to be etched are disposed outside the recess.

The resultant formation of a polysilicon side wall 25 on the left end of BPSG layer 23 of the peripheral circuit area S causes no problem.

The storage electrode 24 of a capacitor has the same height as that of the BPSG layer 23 left unremoved in the peripheral circuit area S, so as to eliminate the difference in height between the memory cell area M and the peripheral circuit area S.

Figure 12J:
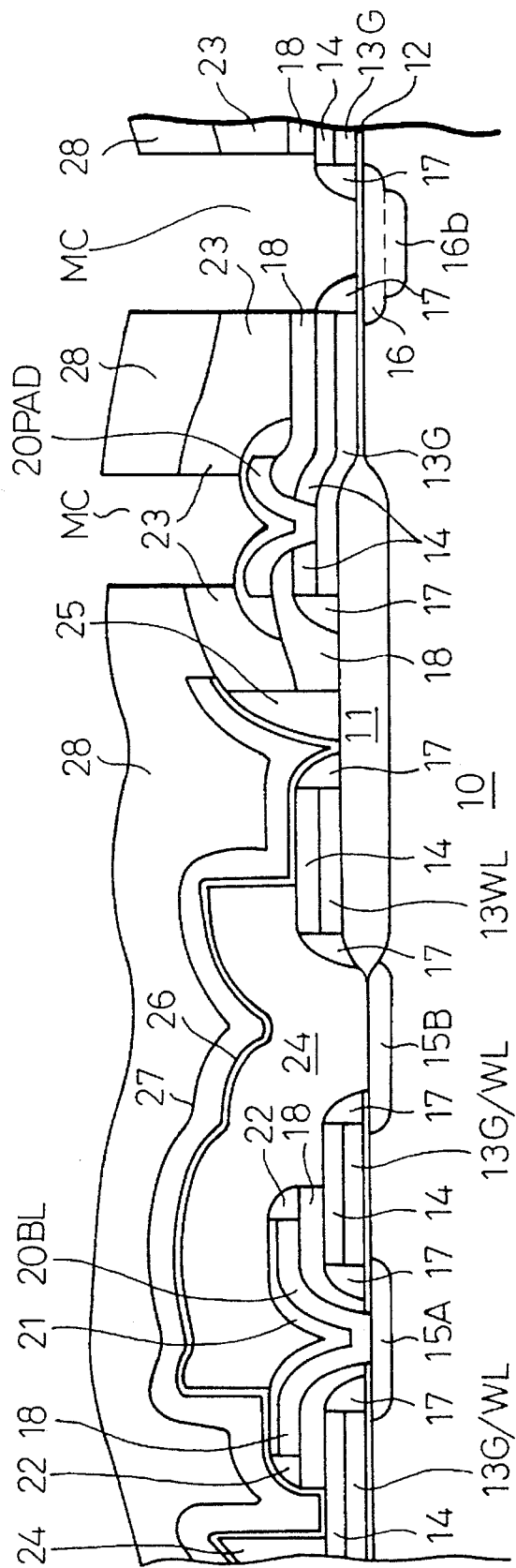

[Step 10] (See FIG. 12(j))

A 5 nm thick silicon nitride layer is grown by a CVD process and is then oxidized in the surface region to provide a dielectric layer 26.

A 100 nm thick phosphorus-containing polysilicon layer 27 is grown by a CVD process and is then patterned by an ordinary photolithographical process to provide a counter electrode 27 of the memory cell.

A second insulating layer 28 (300 nm thick) of BPSG is grown by a CVD process and is then reflowed for planarization by a heat treatment at 850° C. for 15 min in a nitrogen gas atmosphere.

Thereafter, an ordinary photolithographical process is carried out to form a photoresist pattern (not shown) covering the peripheral circuit area S except for the portion in which a contact hole is formed.

By using this photoresist pattern as a mask, the BPSG layers 18 and 23 are etched, with a sufficient etching selectivity kept relative to the silicon nitride layers 14, 17, 21 and 22, to form contact holes MC to expose the source/drain region 16 of a peripheral circuit transistor. This exposes the source/drain region 16 self-aligned with the gate electrode 13G, but does not expose the gate electrode 13G.

As described hereinbefore, an extension pad 20PAD has been formed on the gate electrode 13G by the same laminate layer 20 as the bit line 20BL. The 150 nm thick silicon nitride layer 21 provided on the extension pad 20PAD is significantly thinner than the 350 nm thick silicon nitride layer 14 provided on the gate electrode.

This relationship makes it possible that, when the silicon nitride layers 21 and 14 are removed by etching to a depth of 150 to 200 nm, the extension pad 20PAD is exposed in the left side contact hole MC while, in the right side contact hole MC, the silicon nitride layer 14 is preserved by a thickness of 200 to 150 nm (see also FIG. 12(k)).

It should be noted here that, although this example uses a silicon nitride layer as protective layers 14, 17, 21, and 22 effectively acting as an etching stopper upon etching of the BPSG layers 28 and 23, the protective layers may not limited to a silicon nitride layer but may be a layer of other substances such as alumina, so long as a sufficient etching selectivity is provided relative to the BPSG layers.

[Step 11] (See FIG. 12(k))

To form a metal conductor wiring, a titanium layer (20 nm thick) and a titanium nitride layer (50 nm thick) are sequentially deposited by sputtering and a 300 nm thick tungsten layer is then grown by CVD to provide a laminate layer. The laminate layer is then patterned by an ordinary photolithographical process to form metal conductor wirings 29.

Example 4 described above has the following advantages:

(1) In step 8 (FIG. 12(h)), when the contact hole STC for providing contact between the capacitor storage electrode 24 and the active area ACT, the insulating layer 23 having substantially the same thickness as the height of the electrode 24 is left unremoved, so that the difference in height is eliminated between the memory cell area M and the peripheral circuit area S.

(2) The bit line contact hole BLC has a diameter less than a photolithographically resolvable minimum value, so as to solve the problem encountered when bit lines have a width and space equal to the minimum value. This problem was not conventionally known.

The memory cell shown in FIG. 10 has a high integrated and refined structure in which word lines 13WL and bit lines 20BL have a linear shape to minimize the area occupied thereby and have a width and space set at a photolithographically resolvable minimum value. In an ordinary photolithographical process, a bit line contact hole BLC also cannot be smaller than the width of bit lines having a photolithographically resolvable minimum value.

It is unavoidable for a contact hole, even when it has a diameter equal to a photolithographically resolvable minimum value, to partially bulge out of the bit line width because of possible misalignment. As a result, the portion of semiconductor substrate, that is within the part of contact hole that is bulging out of the bit line width, is undesirably subjected to etching for forming the bit line. This causes problems that junction leakage occurs and the loss of an n-type diffused region increase the resistivity between a bit line and a transfer transistor.

Example 4 solves these problems in a manner such that the silicon oxide side wall 19 effectively regulates the size of a bit line contact hole BLC to be 0.1 µm, which is far smaller than a photolithographically resolvable minimum value of 0.4 µm, as described above, by referring to FIG. 12(e). This makes it possible that the bit lines 20BL is brought into contact to a counterpart 15A of the source/drain regions while ensuring that a bit line 20BL and a word line 13WL do not short-circuit, and a bit line contact hole does not bulge out of the bit line width.

(3) As described in step 10 (FIG. 12(j)), the gate electrode extension pad 20PAD is formed by the same laminate layer 20 as the bit line 20BL while realizing a self-aligned contact between the storage electrode contact hole STC and the bit line 20BL. The gate electrode extension pad 20PAD is utilized to realize self-aligned contact between the metal conductor wiring 29 and the gate electrode of the peripheral circuit area S and connection between the metal conductor wiring 29 and the gate electrode 13G, without additional process steps.

This solves the following problem encountered when connecting the metal conductor wiring 29 to the source/drain region 16 and connecting the metal conductor wiring 29 to the gate electrode.

It will be advantageous if the metal conductor wiring 29 is brought into contact with the source/drain region 16 while being self-aligned with the gate electrode 13G so as to reduce the contact area. To this end, it is necessary that the source/drain region 16 is exposed whereas the gate electrode 13G is not exposed. On the other hand, the metal conductor wiring 29 must be connected to the gate electrode 13G and therefore the gate electrode 13G must be exposed. These situations cannot simultaneously be realized. If contact holes for the source/drain region 16 and the gate electrode are provided in separate process steps, additional steps therefor are necessary, although the above-mentioned problem can be solved.

Example 4 solves this problem in a manner such that the procedure described in (2) is used to form the gate electrode extension pad 20PAD by the same layer 20 as the bit line 20BL, to which the metal conductor wiring 29 is then connected, as described in step 6 (FIG. 12(f)).

In this process, it should be noted that the nitride layer 21 (150 nm thick) on the gate electrode extension pad 20PAD is thinner than the nitride layer 14 (350 nm thick) on the word lines 13WL, 13G, and 13G/WL in order to make it possible that the etching of the contact hole MC for the metal conductor wiring 29 is carried out so that the source/drain region 16 is exposed whereas the neighboring gate electrode 13G is not exposed, and simultaneously the gate electrode extension pad 20PAD is exposed.

As the bit lines 20BL are covered with the nitride layer 21, it is also possible that, in the memory cell area M, the contact hole STC of the storage electrode 24 is formed in self-alignment with both the word line and the bit line.

EXAMPLE 5

Figure 11:
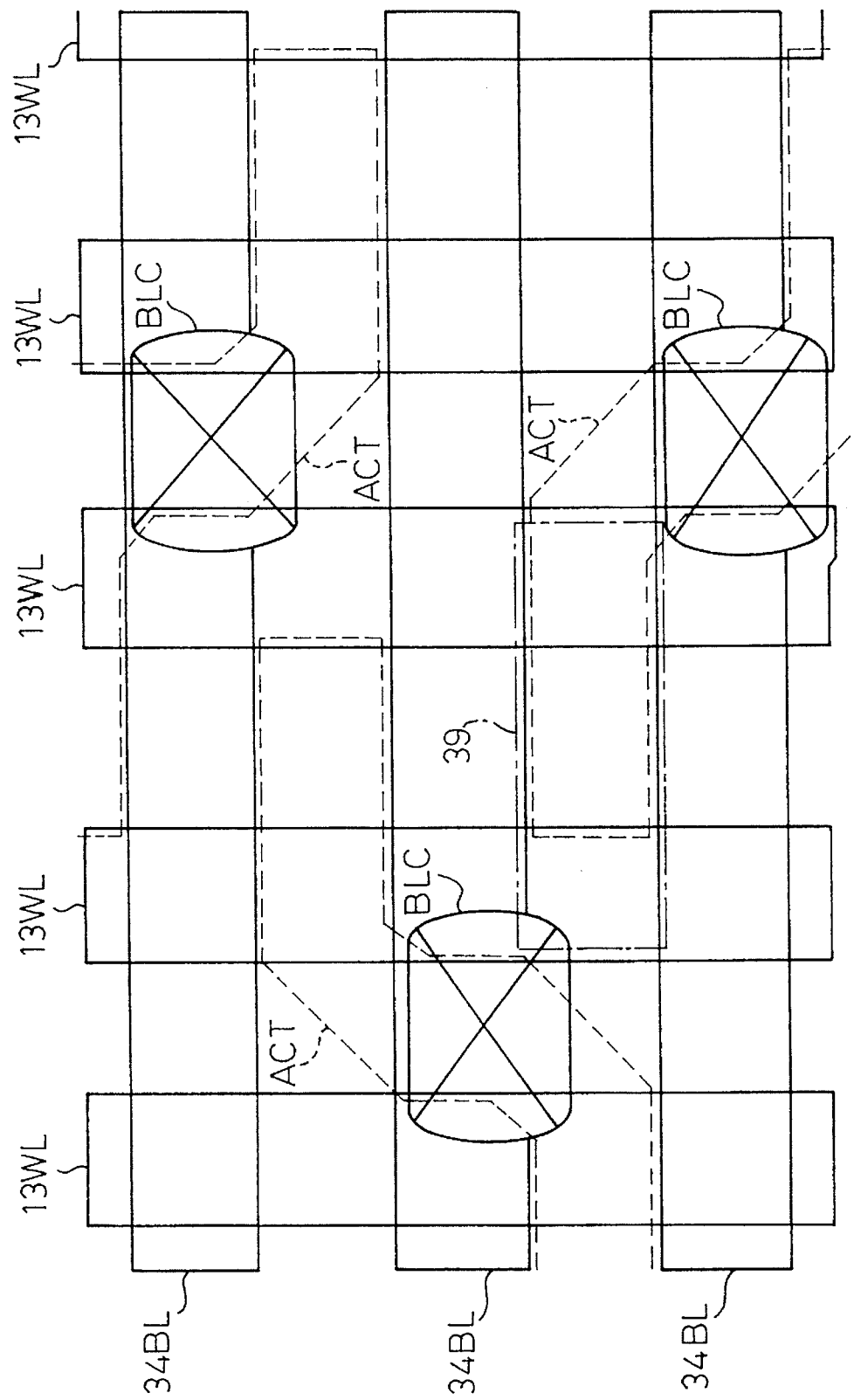
FIG. 11 shows another plan arrangement of a semiconductor memory device according to the present invention.

FIG. 11 shows another plan arrangement of the semiconductor device according to the present invention. This device has basically the same structure as that of Example 4 shown in FIG. 10, except for the following three points.

(1) In Example 4, the semiconductor substrate is protected from being undesirably etched during etching for forming a bit line on a bit line contact hole, because the contact hole has a size smaller than a photolithographically resolvable minimum value so that the bit line contact hole does not bulge out of the etching mask (or photoresist pattern) for defining the bit line pattern. This is achieved by using the silicon oxide layer 19 which reduces the etching area of the BPSG layer.

In Example 5, although a bit line contact hole is greater than the bit line width, the semiconductor substrate is again protected from being undesirably etched, because of an improved photolithographical process as described below.

Namely, after a bit line contact hole is formed and a conductor layer for forming a bit line is formed entirely over the bit line contact hole, in a photolithographical step of forming a photoresist pattern on the conductor layer to provide an etching mask, the light sxposure of the photoresist is intentionally reduced relative to an ordinary photolithographical process so that an amount of the photoresist is left unremoved after a later development of the photoresist in the bit line contact hole bulging out of the mask of the photoresist.

This is achieved by the fact that the photoresist applied in the bit line contact hole is thicker than the other portion and therefore an underexposure condition can be established selectively in the bit line contact hole alone when the light exposure is reduced. The thus-retained photoresist protects the bit line contact hole inside and the underlying semiconductor substrate from etching carried out for forming a bit line above the bit line contact hole.

With the photoresist retained in the contact hole, a bit line is formed by etching in self-alignment with the contact hole.

(2) Based on the same principle as the above, a storage electrode is formed. Namely, after a storage electrode contact hole is formed and a conductor layer for forming a storage electrode is formed entirely over the contact hole, in a photolithographical step of forming a photoresist pattern on the conductor layer to provide an etching mask, the light exposure is intentionally reduced relative to that used in an ordinary photolithographical process.

This exposure is carried out with the peripheral circuit area S masked and the memory cell area M not masked. As the photoresist applied in the storage electrode contact hole is thicker than the other portion and therefore an underexposure condition can be established selectively in the storage electrode contact hole alone when the light exposure is reduced.

As a result, the photoresist can be selectively left remaining not only in the masked peripheral circuit area S, but also in the storage electrode contact hole in the unmasked memory cell area M. By using the remaining photoresist as a mask, the conductor layer for the storage electrode is etched so as to selectively leave the conductor layer unremoved in the storage electrode contact hole alone, thereby forming a storage electrode in self-alignment with the storage electrode contact hole. Thus, no exact size control is necessary to pattern a storage electrode.

(3) As a storage electrode is formed in a crown shape having both sides contributing to the cell capacity, the storage electrode may have a height less than that described in Example 4 to provide a necessary cell capacitance. This is also advantageous because the metal conductor wiring contact hole MC in the peripheral circuit area S has a reduced depth to ensure good coverage of the metal conductor wiring.

These items (1) to (3) will be described in detail in the following related process steps.

Referring to FIGS. 13(a) to 13(m), a process sequence to produce a semiconductor device according to the present invention will be described.

Figure 13A:
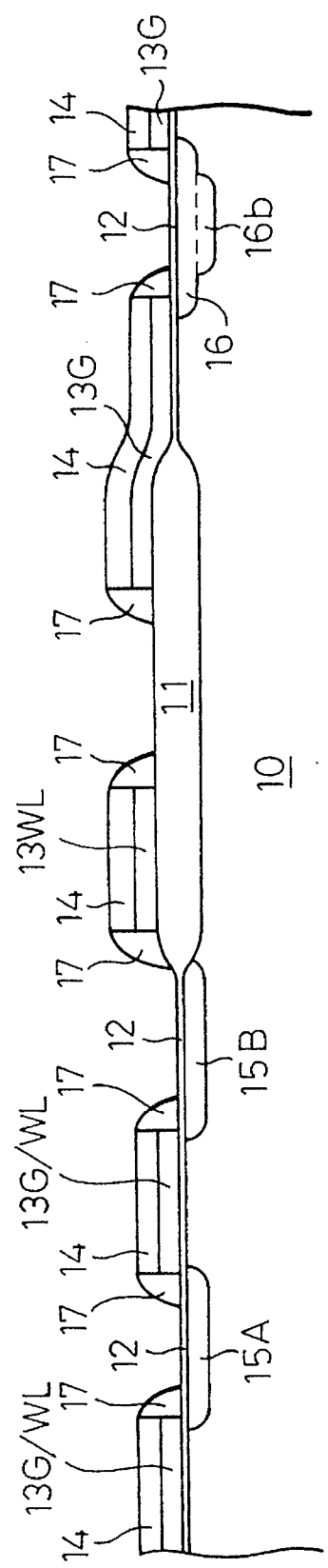

The same steps 1 to 3 as in Example 4 are carried out. FIG. 13(a) shows this situation which is the same as that shown in FIG. 12(c). The subsequent steps will be described below.

[Step 4] (See FIG. 13(b))

A 200 nm thick BPSG layer 31 is grown by a CVD process. Heat treatment is carried out at 850° C. for 15 min in a nitrogen gas atmosphere to reflow and thereby planarize the BPSG layer.

A 20 nm thick silicon nitride layer 32 is then grown by a CVD process.

Thereafter, a 200 nm BPSG layer 33 is grown by a CVD process. Heat treatment is carried out at 850° C. for 15 min in a nitrogen gas atmosphere to reflow and thereby planarize the BPSG layer.

By an ordinary photolithographical process, a bit line contact hole BLC having a diameter of 0.5 μm is formed, which extends through the three layers 31, 32, and 33 to reach a counterpart 15A of a pair of source/drain regions of a memory cell transistor.

This is done by etching the top BPSG layer 33 with a necessary etching selectivity being kept relative to the silicon nitride layer 32, etching the intermediate thin silicon nitride layer 32, and further etching the bottom BPSG layer 31 with a necessary etching selectivity being kept relative to the silicon nitride layer 32. This exposes the source region 15A of the memory cell transistor in a manner such that the source region 15A is self-aligned with the gate electrode 13G.

The thus-formed contact hole BLC is intentionally given a diameter of 0.5 μm, which is greater than the width of 0.4 μm (=photolithographically resolvable minimum value) of the bit line (see FIG. 11). To form a bit line running across the contact hole BLC, it is necessary that a conductor layer is once formed entirely over the substrate and is then etched to leave a bit line BL having a necessary pattern.

Usually, a photoresist pattern providing an etching mask has the same width as a bit line, so that the photoresist pattern cannot entirely cover the large contact hole BLC and part of the contact hole BLC is allowed to bulge out of the photoresist pattern. When the portion of a conductor layer that is located in the bulging part of the contact hole BLC is removed by etching, the underlying portion of the semiconductor substrate is also subjected to the etching to cause the aforementioned problem.

In Example 5 according to the present invention, this problem is solved in the following manner.

By a CVD process, a 50 nm thick phosphorus-containing polysilicon layer and a 120 nm thick tungsten silicide layer are sequentially grown to form a laminate layer 34.

Either a 200 nm thick silicon nitride layer 35, or a laminate layer 35 of a 100 nm thick silicon oxide layer and a 100 nm thick silicon nitride layer, is formed on the laminate layer 34.

The laminate layer 34 is then photolithographically processed to form a bit line 34BL. To this end, a photoresist pattern 36 is formed to providing an etching mask having a pattern corresponding to a necessary bit line pattern.

The elevation on the right half of the photoresist pattern 36 shown in FIG. 13(b) forms a mask corresponding to a bit line pattern. Namely, FIG. 13(b) shows a case in which the photoresist pattern having the same width as the bit line is located slightly out of position toward right.

The left half of the photoresist pattern 36 fills the contact hole BLC. This is realized by using a reduced light exposure or a reduced exposure time during forming the photoresist pattern 36.

Thus, the laminate layer 34 and the silicon nitride layer 35 are masked by the photoresist pattern 36 so as not to be etched but to remain in the contact hole BLC, although the layers 34 and 35 would be exposed to light in a usual process. Namely, the bit line 34BL is formed in self-alignment with the contact hole BLC.

This prevents the semiconductor substrate from being undesirably etched during patterning of the bit line, although a bit lie contact hole is greater that the width of a bit line.

To the same end, Example 4 uses a bit line contact hole BLC smaller than the width of a bit line BL. This is the first difference between Examples 1 and 2.

It should be noted that, to form a storage electrode contact hole STC in a later step, the bit line BL must be protected or covered with a silicon nitride layer. To this end, as shown by "A" in FIG. 13(b), the laminate layer 34 (=polysilicon+ tungsten silicide) is etched more excessively than the layer 35 (=silicon nitride, or silicon oxide+silicon nitride) and the top end of the laminate 34 is located above the level of the silicon nitride layer 32. This allows, in the next step, a side wall silicon nitride 37 can covers the portion of the layers 35 and 34 bulging out of the contact hole BLC in "A" region.

[Step 5] (See FIG. 13(c))

The top BPSG layer 33 is removed by etching with an HF aqueous solution. This etching is terminated by the thin silicon nitride layer 32.

On the thus-exposed silicon nitride layer 32, a 200 nm thick silicon nitride layer 37 is grown by a CVD process.

Figure 13D:
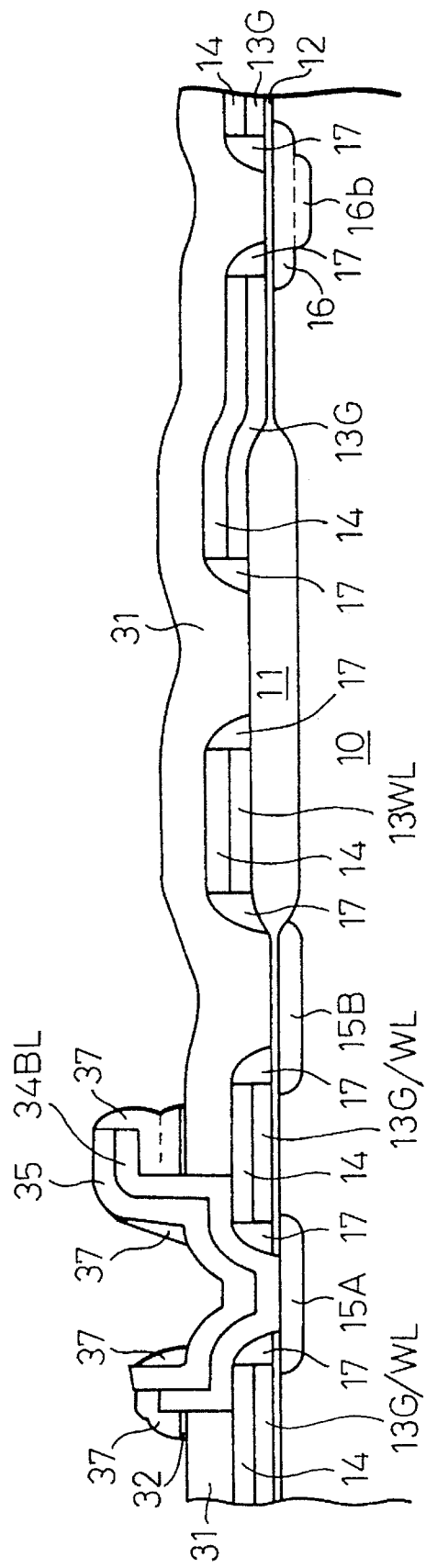

[Step 6] (See FIG. 13(d))

Anisotropic etching is performed to leave the side wall silicon nitride 37 unremoved. In this step, it is also possible that a partial thickness of the silicon nitride layer 32 is left so as to be utilized as a protective layer during an HF-etching in the next step 7 (See FIG. 13(e)).

[Step 7] (See FIG. 13(e) to 13(j))

In the following substeps 1 to 6, a storage electrode of a capacitor in the memory cell area M is formed in self-alignment with the storage electrode contact hole STC.

Figure 13E:
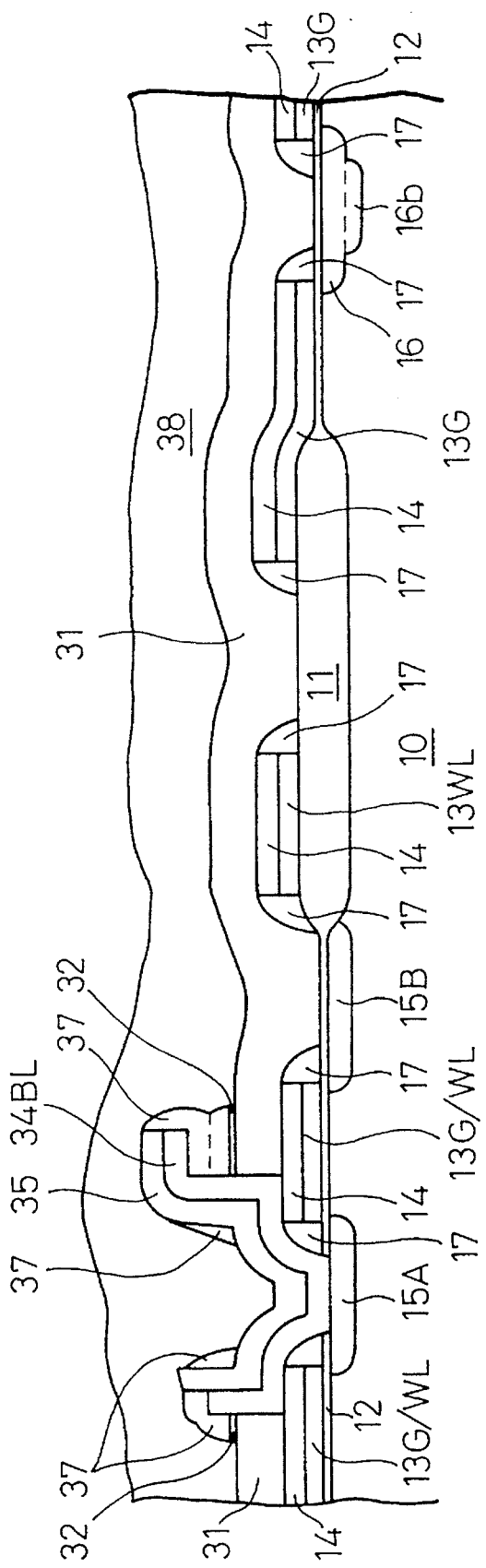

Substep 1 (See FIG. 13(e))

A 400 nm thick BPSG layer 38 is grown by a CVD process entirely over the semiconductor substrate. Heat treatment is carried out at 850° C. for 15 min in a nitrogen gas atmosphere to reflow and thereby planarize the BPSG layer.

Substep 2 (See FIG. 13(f))

By an ordinary photolithographical process, the BPSG layers 38 and 31 are etched, with a sufficient etching selectivity being kept relative to the silicon nitride layers 14, 17, 35 and 37, to form storage electrode contact holes STC in both neighboring sites next to the bit line 34BL, thereby exposing a drain 15B of a memory cell transistor.

Figure 13G:
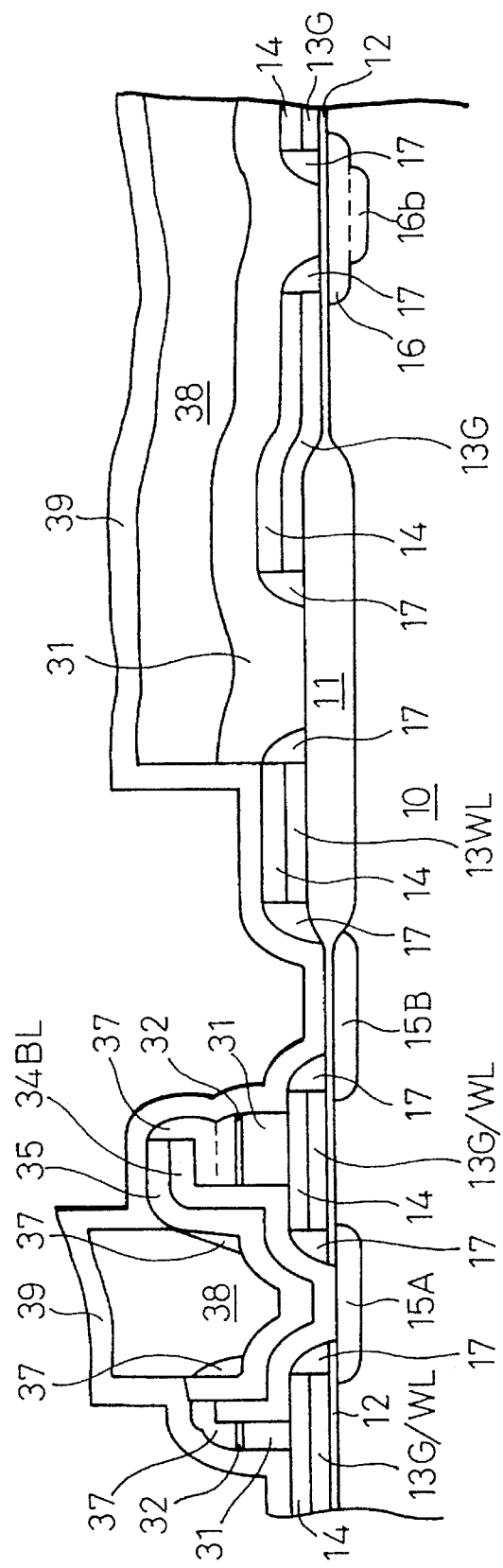

Substep 3 (See FIG. 13(g))

To form a storage electrode of a memory cell, a 100 nm thick phosphorus-containing polysilicon layer 39 is grown entirely over the substrate by a CVD process.

Figure 13H:
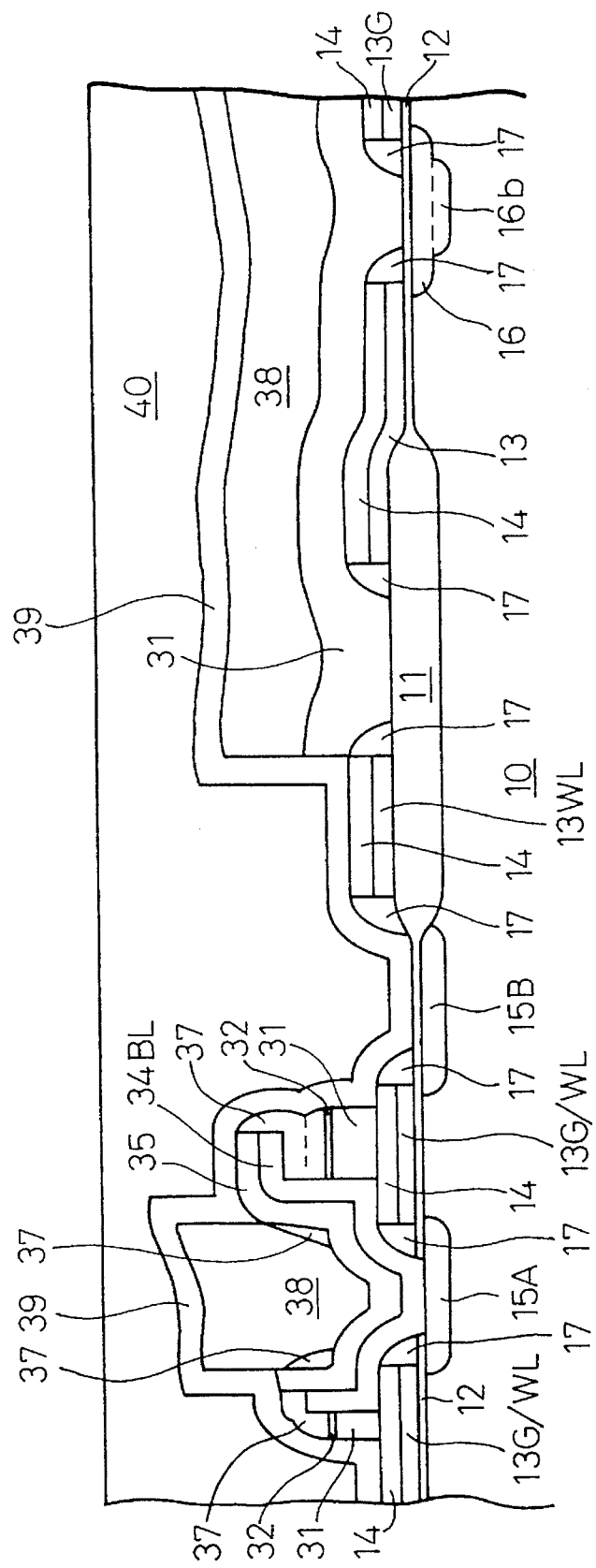

Substep 4 (See FIG. 13(h))

A photoresist layer 40 is then formed entirely over the substrate.

Substep 5 (See FIG. 13(i))

The photoresist layer 40 is exposed to light via a mask covering the peripheral circuit area S and is then developed. The exposure is carried out for a reduced exposure time to provide a light exposure controlled to be less than that usually used so that the photoresist layer 40 is left unremoved not only in the masked peripheral circuit area S but also in the storage electrode contact hole STC which is not masked but contains the photoresist layer 40 having a larger height. This is based on the same principle as described on the photoresist 36 used for forming the bit line contact hole BLC.

Figure 13J:
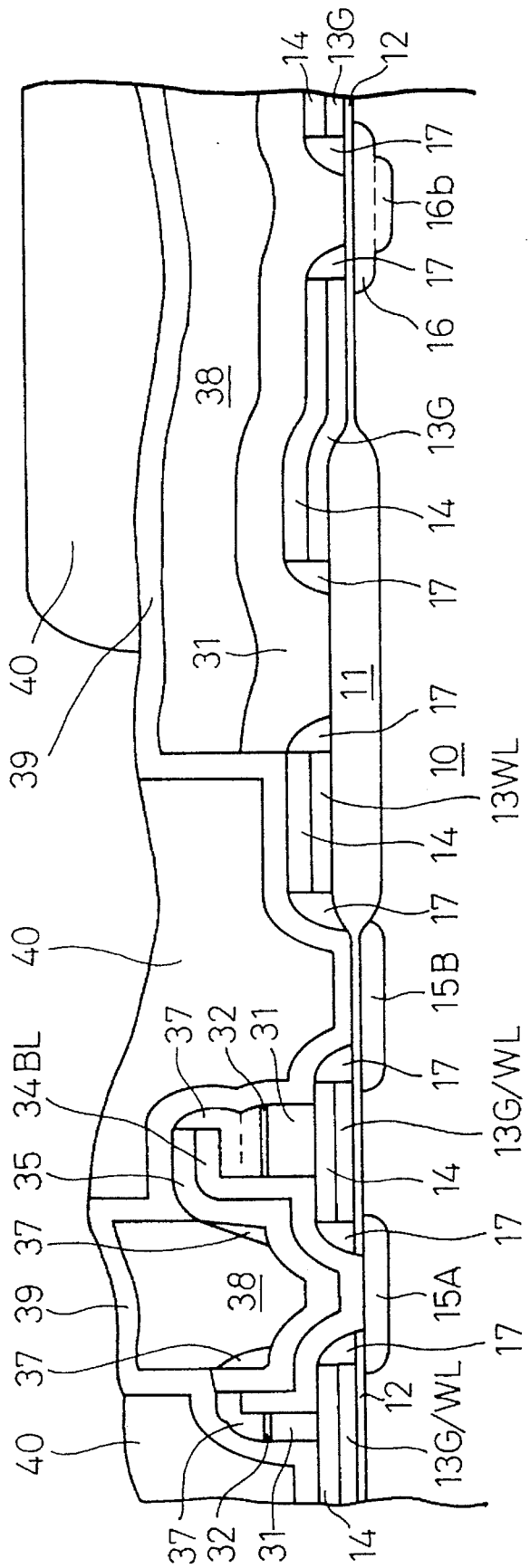
Figure 13J:
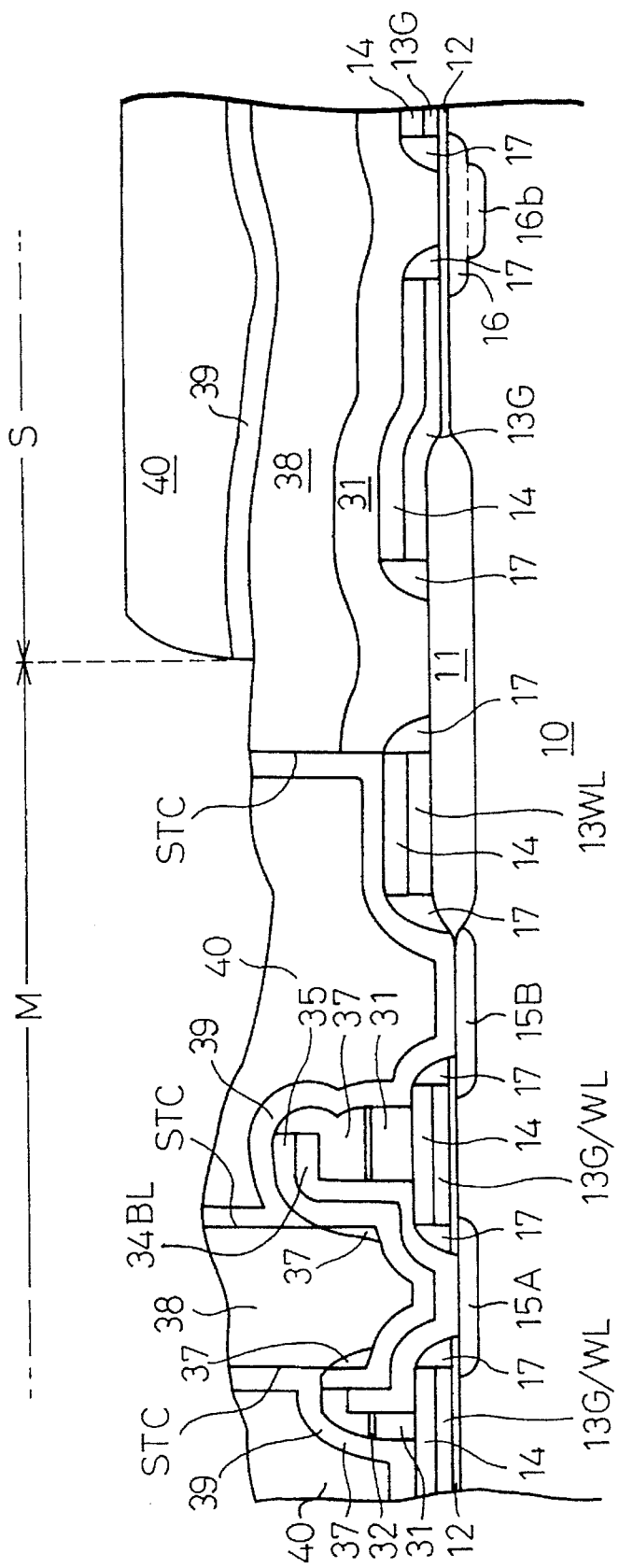

Substep 6 (See FIG. 13(j))

The polysilicon layer 39 is etched by using a mask formed of the photoresist 40 left in the peripheral circuit area S and the storage electrode contact hole STC. The storage electrode is then formed in self-alignment with the storage electrode contact hole STC.

Figure 13K:
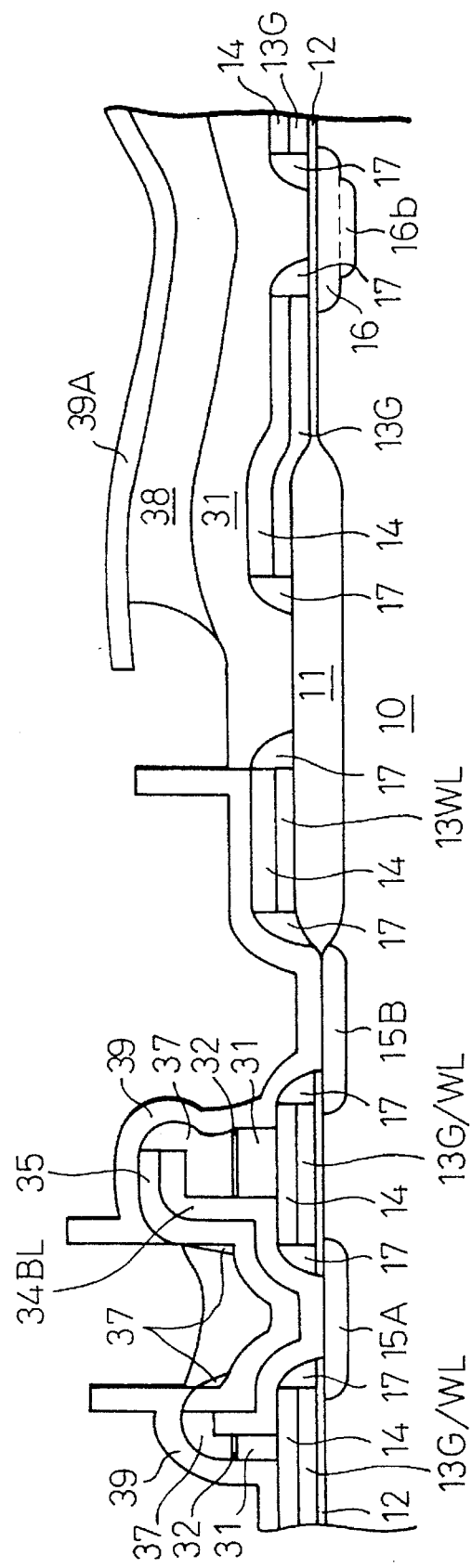

[Step 8] (FIG. 13(k))

After the photoresist 40 is removed, the BPSG layer 38 is then partially removed by etching in an HF aqueous solution to expose part of the outer circumferential surface of the storage electrode 39. This forms a storage electrode in the form of a royal crown. A pent roof of the polysilicon 39 formed at an end of the peripheral circuit area S causes no problem.

[Step 9] (FIG. 13(l))

A 5 nm thick silicon nitride layer is grown by a CVD process and is then oxidized in the surface region to provide a dielectric layer 41.

A 100 nm thick phosphorus-containing polysilicon layer 42 is then grown by a CVD process. An ordinary photolithographical process is carried out to form a photoresist pattern (not shown) covering the memory cell area M and, by using the photoresist pattern as a mask, the polysilicon layer 42 and the dielectric layer 41 are etched. This provides the memory cell area M with a capacitor composed of the storage electrode 39, the dielectric layer 39, and a counter electrode 42. During the etching of the dielectric layer 41, the polysilicon pent roof 39 is simultaneously removed.

The thus-formed capacitor has the storage electrode 39 in a crown shape, in which both sides of the circumference contribute to the memory cell capacity, so that the capacitor height can be less than that formed in Example 4 to provide a necessary capacitance. This is also advantageous because the metal conductor wiring contact hole MC in the peripheral circuit area S has a reduced depth to ensure good coverage of the metal conductor wiring in the next step 10.

Figure 13M:
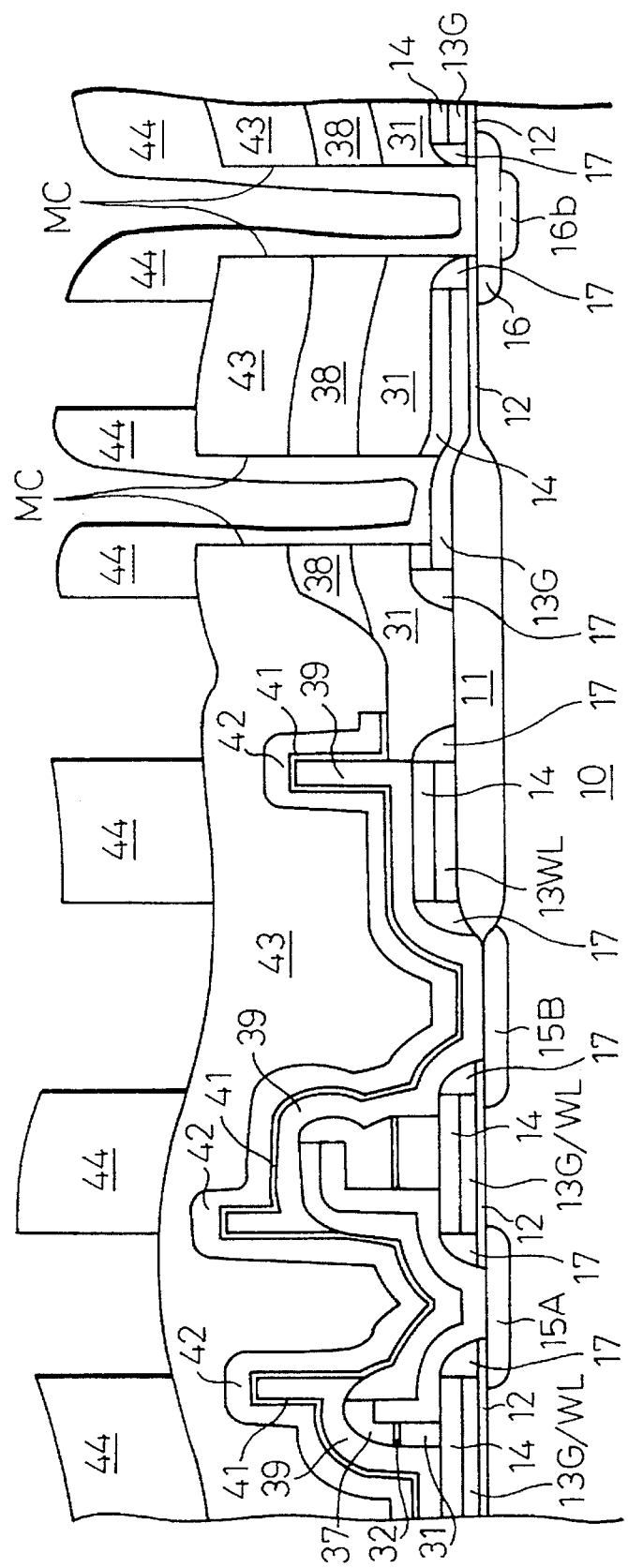

[Step 10] (see FIG. 13(m))

A 400 nm thick BPSG layer 43 is grown entirely over the substrate by a CVD process. Heat treatment is carried out at 850° C. for 15 min in a nitrogen gas atmosphere to reflow and planarize the BPSG layer 43.

An ordinary photolithographical process is carried out to open a contact hole MC extending through the BPSG layers 43, 38, and 31 in the peripheral circuit area S and to thereby expose the gate electrode 13G and the diffused region 16 of the peripheral circuit. Metal conductor wiring 44 are then formed.

Example 5 the difference in height between the memory cell area M and the peripheral circuit area S in the same manner as in Example 4.

Namely, the BPSG layer 38 formed entirely over the substrate is removed in the memory cell area M during removal of the storage electrode contact hole STC and the storage electrode 39, but remains unremoved in the peripheral circuit area S. The remaining BPSG layer 39 has substantially the same height as the capacitor storage electrode 39. Thus, the difference in height between the memory cell area M and the peripheral circuit area S is eliminated without requiring additional process steps, as in Example 4.

As hereinabove described, the present invention provides a semiconductor device and a process of producing same, in which the difference in height between the memory cell area and the peripheral circuit area is eliminated to facilitate the formation of conductor wirings running across these areas, without causing problems such as an increase in the number of process steps. Moreover, according to a preferred embodiment of the present invention, contact holes in the memory cell area can be formed unlimitedly from the photolithographically resolvable minimum value, so that word liens and bit liens can be advantageously refined to the photolithographically resolvable minimum value.

We claim:

1. A process of producing a semiconductor device, said process comprising the steps of:

(A) forming a field oxide layer on a semiconductor substrate to define thereon a memory cell area in which a memory cell composed of a capacitor element is formed, and a peripheral circuit area in which a peripheral circuit for controlling said memory cell is formed;

(B) forming, on said semiconductor substrate including said memory cell area and said peripheral circuit area, a gate electrode in said peripheral circuit area and a word line conductor pattern in said memory cell area, said gate electrode and said word line conductor pattern having a top surface covered with a first protective layer;

(C) forming a pair of diffused regions in said semiconductor substrate by diffusing an impurity thereinto, using said word line conductor pattern, said gate electrode and said first protective layer covering said top surface as a mask;

(D) forming a second protective layer covering said surfaces of said word line conductor pattern and said gate electrode;

(E) forming a first insulating layer on said semiconductor substrate including said word line conductor pattern, said gate electrode and said diffused regions;

(F) selectively removing said first insulting layer by etching in the entire said memory cell area while leaving said first insulating layer unremoved in said peripheral circuit area and while leaving said word line conductor pattern unremoved together with said first protective layer and said second protective layer covering said top surface and said side surfaces of said word line conductor pattern and forming a first contact hole having a circumference defined by said second protective layer covering said side surfaces of said word line conductor pattern, said first contact hole exposing a counterpart of said pair of diffused regions in said memory cell area; and (G) forming, in said memory cell area, a capacitor element composed of a storage electrode being connected therethrough to said counterpart of said diffused regions through said first contact hole, a counter electrode, and a dielectric layer effecting insulation and isolation between said storage electrode and said counter electrode.

2. A processing according to claim 1, wherein said first insulating layer in said peripheral circuit area has a top surface lying on a same level as a top surface of said storage electrode of said capacitor element in said memory cell area.

3. A processing according to claim 1, wherein said first insulating layer includes a lower portion and an upper portion, after forming said lower portion of said first insulating layer and before forming said upper portion of said first insulating layer, said process further comprises the following substeps:

(1) forming, in said lower of said first insulating layer, openings having a depth smaller than the thickness of said lower portion of said first insulating layer in a portion above the other counterpart of said pair of diffused regions of said memory cell and in a portion above said gate electrode of said peripheral circuit area;

(2) forming a silicon oxide layer on said lower portion of said first insulating layer;

(3) anisotropically etching said silicon oxide layer entirely so as to leave said silicon oxide layer in a ring form unremoved on a bottom circumferential corner of said openings and to form second contact holes extending from bottoms of said openings to the other counterpart of said pair of diffused regions and to said gate electrode, said second contact holes having a side wall composed of said lower portion of said first insulating layer and an upper end composed of said silicon oxide layer in a ring form, and said second contact holes having a diameter regulated or defined by said ring to be smaller that a width of a bit line; and (4) forming, in said memory cell area, a bit line conductor pattern connected to the other counterpart of said pair of diffused regions through one of said second contact holes and, in said peripheral circuit area, a gate electrode extension pad connected to said gate electrode through one of said second contact holes, said bit line conductor pattern and said gate electrode extension pad having top and side surfaces covered with a third protective layer.

4. A process according to claim 3, wherein said first protective layer, which covers said top surface of said gate electrode in said peripheral circuit area, is thicker than said third protective layer, which covers said gate electrode extension pad connected to said gate electrode.

5. A process according to claim 1, wherein after forming a lower portion of said first insulating layer and before forming an upper portion of said first insulating layer, said process further comprising the substeps of:

(1) forming a third protective layer on said lower portion of said first insulating layer;

(2) forming a second insulating layer on said third protective layer;

(3) forming a second contact hole extending through said lower portion of said first insulating layer, said third protective layer, and said second insulating layer to expose the other counterpart of said pair of diffused regions in said memory cell area, said second contact hole having a bottom circumference defined by said second protective layer covering said side surfaces of said word line conductor pattern, and said second contact hole having an opening diameter larger than a width of a bit line conductor pattern;

(4) forming a conductor layer entirely over the semiconductor substrate;

(5) forming a fourth protective layer effective in etching of said first insulating layer and said second insulating layer entirely over said conductor layer;

(6) forming a first photoresist pattern for defining said bit line conductor pattern at said second contact hole by a photolithographical process using a reduced light exposure controlled so that an amount of photoresist filling said second contact hole in a portion unmasked because of unavoidable misalignment upon exposure remains unremoved by later development and forms in said second contact hole a second photoresist pattern continuous with said first photoresist pattern;

(7) etching said conductor layer and said fourth protective layer together by using said second photoresist pattern as a mask for a bit line contact connected to the other counterpart of said pair of diffused regions through said second contact hole, said bit line contact being self-aligned with said second contact hole.

6. A process according to claim 1, wherein said steps (F) and (G) comprise the following substeps of:
   (1) forming a lower portion, and then an upper portion, of said first insulating layer;
   (2) selectively etching said first insulating layer in said memory cell area to form said first contact hole;
   (3) forming a conductor layer entirely over said semiconductor substrate;
   (4) forming a photoresist layer covering said conductor layer;
   (5) exposing said photoresist layer to light while masking said peripheral circuit area, in a photolithographical process using a reduced light exposure controlled so that said photoresist layer remains unremoved upon later development not only in said peripheral circuit area, which is masked, but also in said first contact hole in said memory cell area, which is not masked; and
   (6) etching said conductor layer by using said photoresist remaining unremoved in said peripheral circuit area and in said first contact hole, to form a storage electrode in the form of a crown and self-aligned with said first contact hole.

7. A process according to claim 6, which, after the step (6), further comprises the step of:
   removing said photoresist layer; and
   then removing, by etching, part of said first insulating layer in contact with the outer side wall of said storage electrode in the form of a crown to expose part of said outer side wall of said storage electrode.

8. A process according to claim 7, which further comprises the steps of:
   sequentially forming a dielectric layer and a second conductor layer thereon entirely over the semiconductor substrate; and
   then removing, by etching, said dielectric layer and said second conductor layer together in said peripheral circuit area to form a capacitor element composed of said storage electrode in the form of a royal crown, a counter electrode made of said second conductor layer, and said dielectric layer which isolates and insulates said storage electrode and said counter electrode from each other.

9. A process according to claim 1, wherein said first insulating layer consists of upper and lower portions.

10. A process of producing a semiconductor device, said process comprising the steps of:
   (A) forming a field oxide layer on a semiconductor substrate to define thereon a memory cell area in which a memory cell composed of a capacitor element is formed, and a peripheral circuit area in which a peripheral circuit for controlling said memory cell is formed;
   (B) forming, on said semiconductor substrate including said memory cell area and said peripheral circuit area, a gate electrode in said peripheral circuit area and a word line conductor pattern in said memory cell area, said gate electrode and said word line conductor pattern having a top surface covered with a first protective layer;
   (C) forming a pair of diffused regions in said semiconductor substrate by diffusing an impurity thereinto, using said word line conductor pattern, said gate electrode and said first protective layer covering said top surface as a mask;
   (D) forming a first insulating layer on said semiconductor substrate in said peripheral circuit area and said memory cell area, forming a first contact hole in said first insulating layer in said memory cell area and forming a conductive pattern across the first contact hole with a second protective layer;
   (E) forming a second insulating layer on said semiconductor substrate including said peripheral circuit area and said memory cell area;
   (F) selectively removing said second insulating layer in said memory cell area forming a second contact hole exposing a counterpart of said pair of diffused regions in said memory cell area;
   (G) forming a polysilicon layer over the semiconductor substrate and then forming a photoresist thereon over the semiconductor substrate;
   (H) selectively removing the photoresist layer in the memory cell area;
   (I) selective etching said polysilicon layer in said memory cell area using a mask formed by the photoresist left in the peripheral circuit area and forming a storage electrode in self alignment with said second contact hole;
   (J) removing the remaining photoresist from the memory cell area and the peripheral cell area and partly removing the second insulating layer to expose an outer circumferential surface of the storage electrode; and
   (K) forming in said memory cell area a crown shaped capacitor element composed of a crown shaped storage electrode being connected therethrough to said counterpart of said diffused regions through said second contact hole, a counter electrode, an a dielectric layer insulating and isolating said storage electrode and said counter electrode.

* * * * *